(12) United States Patent
Nishimata et al.

(10) Patent No.: US 10,723,945 B2
(45) Date of Patent: Jul. 28, 2020

(54) METHOD OF PRODUCING ALUMINATE FLUORESCENT MATERIAL, ALUMINATE FLUORESCENT MATERIAL, AND LIGHT EMITTING DEVICE

(71) Applicant: NICHIA CORPORATION, Anan-shi, Tokushima (JP)

(72) Inventors: Kazuya Nishimata, Anan (JP); Tomokazu Yoshida, Anan (JP); Shoji Hosokawa, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 384 days.

(21) Appl. No.: 15/857,926

(22) Filed: Dec. 29, 2017

(65) Prior Publication Data

US 2018/0265782 A1    Sep. 20, 2018

(30) Foreign Application Priority Data

Mar. 15, 2017 (JP) ................. 2017-050486
Dec. 20, 2017 (JP) ................. 2017-244375

(51) Int. Cl.
| | | |
|---|---|---|
| *C09K 11/77* | (2006.01) | |
| *C09K 11/55* | (2006.01) | |
| *C09K 11/57* | (2006.01) | |
| *C09K 11/64* | (2006.01) | |
| *H01L 33/50* | (2010.01) | |

(52) U.S. Cl.
CPC .......... *C09K 11/7734* (2013.01); *C09K 11/55* (2013.01); *C09K 11/57* (2013.01); *C09K 11/64* (2013.01); *H01L 33/504* (2013.01)

(58) Field of Classification Search
CPC ................................. C09K 11/7734
See application file for complete search history.

(56) References Cited

U.S. PATENT DOCUMENTS

| | | | |
|---|---|---|---|
| 7,961,762 B2 | 6/2011 | Ishii et al. | |
| 2009/0154195 A1 | 6/2009 | Ishii et al. | |
| 2010/0322275 A1 | 12/2010 | Ishii et al. | |
| 2011/0006334 A1 | 1/2011 | Ishii et al. | |
| 2016/0347999 A1 | 12/2016 | Morikawa et al. | |
| 2016/0355731 A1 | 12/2016 | Aoyagi et al. | |

FOREIGN PATENT DOCUMENTS

| | | |
|---|---|---|
| JP | 2002249766 A | 9/2002 |
| JP | 2004155907 A | 6/2004 |
| JP | 2007254638 A | 10/2007 |
| JP | 2010047756 A | 3/2010 |
| WO | 2007037339 A1 | 4/2007 |
| WO | 2008096545 A1 | 8/2008 |
| WO | 2009107535 A1 | 9/2009 |
| WO | 2010098426 A1 | 9/2010 |

OTHER PUBLICATIONS

Extended European Search Report dated Sep. 6, 2018 for European Patent Application No. 18151279.9.

*Primary Examiner* — C Melissa Koslow
(74) *Attorney, Agent, or Firm* — Hunton Andrews Kurth LLP

(57) ABSTRACT

Disclosed are a method of producing an aluminate fluorescent material, such an aluminate fluorescent material, and a light emitting device. The aluminate fluorescent material production method includes: subjecting a first mixture prepared by mixing a compound containing at least one metal element selected from the group consisting of Ba, Sr and Ca, and at least one compound selected from the group consisting of a compound containing Mn and a compound containing Eu, and a compound containing Al, in which a compound containing Mg may be optionally mixed, to first heat treatment to give a first calcined product having an average particle diameter D1, as measured according to a Fisher Sub-Sieve Sizer method, of 6 μm or more; and subjecting a second mixture prepared by mixing a compound containing at least one metal element selected from the group consisting of Ba, Sr and Ca, at least one compound selected from the group consisting of a compound containing Mn and a compound containing Eu, and a compound containing Al, and the first calcined product whose content is 10% by mass or more and 90% by mass or less relative to the total amount of the second mixture, in which a compound containing Mg may be optionally mixed, to second heat treatment to give a second calcined product.

20 Claims, 5 Drawing Sheets

METHOD OF PRODUCING ALUMINATE FLUORESCENT MATERIAL, ALUMINATE FLUORESCENT MATERIAL, AND LIGHT EMITTING DEVICE

CROSS-REFERENCE TO RELATED PATENT APPLICATION

This application claims priority to Japanese Patent Application No. 2017-050486, filed on Mar. 15, 2017, and Japanese Patent Application No. 2017-244375, filed on Dec. 20, 2017, the entire disclosures of which are incorporated herein by references in their entirety.

BACKGROUND

Technical Field

The present disclosure relates to a method of producing an aluminate fluorescent material, an aluminate fluorescent material, and a light emitting device. In this specification, the "fluorescent material" is used in the same meaning as a "fluorescent phosphor".

Description of Related Art

Various light emitting devices that emit white light, bulb color light, or orange light by a combination of a light emitting diode (LED) and a fluorescent material have been developed. In these light emitting devices, a desired luminescent color can be obtained according to the principle of light color mixing. As a light emitting device, one that emits white light by combination of a light emitting element to emit blue color as an excitation light source, and a fluorescent material to emit green color and a fluorescent material to emit red color when excited by the light from the light source, is known.

Use of these light emitting devices in a broad field of ordinary lightings, in-car lighting, displays, backlights for liquid crystals and others is being promoted.

As a fluorescent material that emits green color for use in light emitting devices, for example, in Japanese Unexamined Patent Publication No. 2004-155907 discloses a manganese-activated aluminate fluorescent material having a composition represented by $(Ba, Sr)MgAl_{10}O_{17}:Mn^{2+}$.

SUMMARY

However, the manganese-activated aluminate fluorescent material disclosed in Japanese Unexamined Patent Publication No. 2004-155907 is excited with vacuum UV rays having a wavelength of about 10 nm to 190 nm or so, concretely vacuum UV rays at 146 nm to give a high emission brightness, but when combined with a light emitting element having an emission peak wavelength in a range of 380 nm or more and 485 nm or less (hereinafter this may be referred to as "near UV to blue region"), is insufficient in emission brightness.

Accordingly, an object of a first embodiment of the present disclosure is to provide a method of producing an aluminate fluorescent material capable of having a high emission intensity through photoexcitation in a near UV to blue region, and to provide such an aluminate fluorescent material and a light emitting device.

For solving the above-mentioned problems, the present disclosure includes the following aspects.

The first embodiment of the present disclosure is a method of producing an aluminate fluorescent material, including:

a step of subjecting a first mixture prepared by mixing a compound containing at least one metal element selected from the group consisting of Ba, Sr and Ca, at least one compound selected from a compound containing Mn and a compound containing Eu, and a compound containing Al, in which a compound containing Mg may be optionally mixed, to first heat treatment to give a first calcined product having an average particle diameter D1, as measured according to an FSSS (Fisher Sub-Sieve Sizer) method, of 6 μm or more, and a step of subjecting a second mixture prepared by mixing a compound containing at least one metal element selected from the group consisting of Ba, Sr and Ca, at least one compound selected from a compound containing Mn and a compound containing Eu, a compound containing Al, and the first calcined product whose content is 10% by mass or more and 90% by mass or less relative to the total amount of the second mixture, in which a compound containing Mg may be optionally mixed, to second heat treatment to give a second calcined product.

The second embodiment of the present disclosure is an aluminate fluorescent material having an average particle diameter D2, as measured according to an FSSS method, of 13 μm or more and/or having a volume-average particle diameter Dm2, as measured according to a laser diffraction scattering particle size distribution measuring method, of 20 μm or more, and having a composition represented by the following formula (I):

$$X^1_p Eu_t Mg_q Mn_r Al_s O_{p+t+q+r+1.5s} \qquad (I)$$

wherein $X^1$ represents at least one element selected from the group consisting of Ba, Sr and Ca, and p, q, r, s, and t each satisfies $0.5 \leq p \leq 1.0$, $0 \leq q \leq 1.0$, $0 \leq r \leq 0.7$, $8.5 \leq s \leq 13.0$, $0 \leq t \leq 0.5$, $0.5 \leq p+t \leq 1.2$, $0.1 \leq r+t \leq 0.7$, and $0.2 \leq q+r \leq 1.0$.

The third embodiment of the present disclosure is an aluminate fluorescent material having an average circle-equivalent diameter Dc of 13 μm or more, and having a composition represented by the following formula (I):

$$X^1_p Eu_t Mg_q Mn_r Al_s O_{p+t+q+r+1.5s} \qquad (I)$$

wherein $X^1$ represents at least one element selected from the group consisting of Ba, Sr and Ca, and p, q, r, s, and t each satisfies $0.5 \leq p \leq 1.0$, $0 \leq q \leq 1.0$, $0 \leq r \leq 0.7$, $8.5 \leq s \leq 13.0$, $0 \leq t \leq 0.5$, $0.5 \leq p+t \leq 1.2$, $0.1 \leq r+t \leq 0.7$, and $0.2 \leq q+r \leq 1.0$.

The fourth embodiment of the present disclosure is a light emitting device including an aluminate fluorescent material according to the present disclosure and an excitation light source having an emission peak wavelength in a range of 380 nm or more and 485 nm or less.

According to embodiments of the present disclosure, a production method is provided for producing an aluminate fluorescent material having a high emission intensity through photoexcitation in a near UV to blue region, an aluminate fluorescent material, and a light emitting device comprising the aluminate fluorescent material.

DETAILED DESCRIPTION

Figure 1:
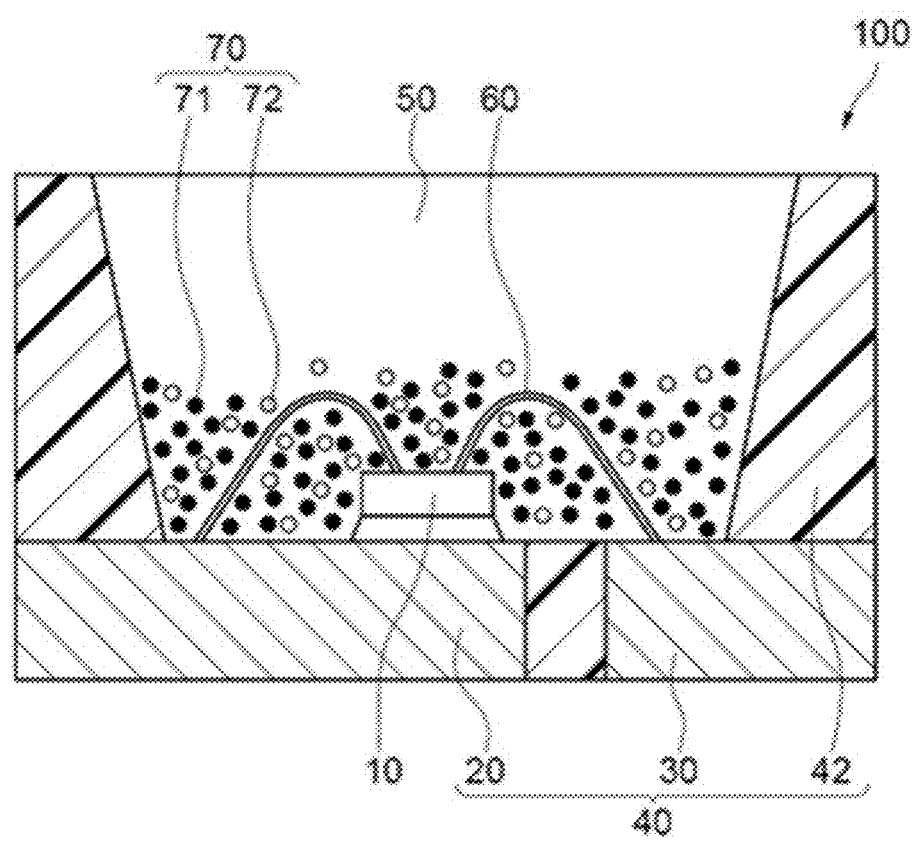
FIG. 1 is a schematic cross-sectional view showing one example of a light emitting device according to the present disclosure.

The aluminate fluorescent material production method, the aluminate fluorescent material and the light emitting device according to embodiments of the present invention are described below. The embodiments shown below are exemplifications for exemplifying the technical idea of the present invention, and the present invention is not limited to the aluminate fluorescent material production method, the aluminate fluorescent material and the light emitting device using the same mentioned below. The relationship between the color name and the chromaticity coordinate, and the relationship between the wavelength range of light and the color name of monochromatic light follow JIS Z8110.

Method for Producing Aluminate Fluorescent Material

The production method for an aluminate fluorescent material of the first embodiment of the present disclosure includes a step of subjecting a first mixture prepared by mixing a compound containing at least one metal element selected from the group consisting of Ba, Sr and Ca, at least one compound selected from a compound containing Mn and a compound containing Eu, and a compound containing Al, in which a compound containing Mg may be optionally mixed, to first heat treatment to give a first calcined product having an average particle diameter (Fisher Sub-Sieve Sizer) D1, as measured according to an FSSS method, of 6 µm or more, and a step of subjecting a second mixture prepared by mixing a compound containing at least one metal element selected from the group consisting of Ba, Sr and Ca, at least one compound selected from a compound containing Mn and a compound containing Eu, a compound containing Al, and the first calcined product whose content is 10% by mass or more and 90% by mass or less relative to the total amount of the second mixture, in which a compound containing Mg may be optionally mixed, to second heat treatment to give a second calcined product.

According to this embodiment, crystal growth is promoted to give a second calcined product having a large average particle diameter. The second calcined product can be used as an aluminate fluorescent material having a large average particle diameter and having a high emission intensity.

First Heat Treatment

The first mixture contains a compound containing at least one metal element selected from the group consisting of Ba, Sr and Ca, and at least one compound selected from a compound containing Mn and a compound containing Eu, and a compound containing Al, and optionally a compound containing Mg. The first mixture preferably contains a flux, and preferably along with the flux, the mixture is subjected to first heat treatment to give a first calcined product having an average particle diameter D1, as measured according to an FSSS method, of 6 µm or more. The first mixture preferably contains a compound containing Mn. The FSSS (Fisher Sub-Sieve Sizer) method is a type of an air permeability method for measuring a specific surface area by utilizing the flow resistance of air to determine a particle size.

For the first mixture, the constituent compounds containing each element may be metered to be in a desired blending ratio and ground and mixed, for example, using a ball mill, a vibrational mill, a hammer mill, a mortar with a pestle. For mixing the first mixture, for example, a mixing machine such as a ribbon blender, a Henschel mixer, a V-shaped blender may be used, and using both a dry-type grinding machine and a mixing machine, the components may be ground and mixed. The components may be mixed in a dry-type mixing method, or in a wet-type mixing method with a solvent added thereto. Preferably, the components are mixed in a dry-type mixing method. This is because the dry-type mixing method can shorten the process time more than the wet-type mixing method, and can therefore improve productivity.

The first mixture may be heat-treated in a crucible, a boat formed of a material of a carbonaceous substance such as graphite, or boron nitride (BN), aluminum oxide (alumina), tungsten (W) or molybdenum (Mo).

The first heat treatment temperature is preferably in a range of 1,000° C. or higher and 1,800° C. or lower, more preferably in a range of 1,100° C. or higher and 1,750° C. or lower, even more preferably in a range of 1,200° C. or higher and 1,700° C. or lower, still more preferably in a range of 1,300° C. or more and 1,650° C. or lower, especially preferably in a range of 1,400° C. or higher and 1,600° C. or lower. For the heat treatment, for example, an electric furnace or a gas furnace may be used.

The atmosphere for the first heat treatment may be an inert atmosphere containing argon or nitrogen, or a reductive atmosphere containing hydrogen, or an oxidative atmosphere containing oxygen such as air, etc. Preferably, the atmosphere for the first heat treatment is a reductive atmosphere, and more specifically, a reductive atmosphere containing hydrogen and nitrogen is more preferred. In an atmosphere having a high reduction power such as a reductive atmosphere containing hydrogen and nitrogen, the reactivity of the first mixture is good and the mixture can be heat-treated under an atmospheric pressure. In the reductive atmosphere, the hydrogen gas is preferably contained in an amount of 0.5% by volume or more, more preferably 1% by volume or more, still more preferably 3% by volume or more.

The first heat treatment time differs depending on the heating rate, the heat treatment atmosphere and others, and the time is, after reaching the first heat treatment temperature in the range of 1,000° C. or higher and 1,800° C. or lower, preferably 1 hour or more, more preferably 2 hours or more, even more preferably 3 hours or more, and is preferably 20 hours or less, more preferably 18 hours or less, even more preferably 15 hours or less.

After the first heat treatment and before the second heat treatment, the first calcined product may be dispersed by a step of dispersing to be described later. Regarding the step of dispersing the first calcined product, for example, the first calcined product may be classified, through wet-process dispersion, wet-process screening, dewatering, drying, dry-process screening to give a first calcined product having an average particle diameter D1, as measured according to the FSSS method, of 6 μm or more. As the solvent for the wet-process dispersion, for example, deionized water may be used. The time for the wet-process dispersion varies depending on the solid dispersion medium or the solvent to be used, but is preferably 30 minutes or more, more preferably 60 minutes or more, even more preferably 90 minutes or more, still more preferably 120 minutes or more, and is preferably 420 minutes or less. When the first calcined product is wet-dispersed within a range of preferably 30 minutes or more and 420 minutes or less, and when the resultant aluminate fluorescent material is used in a light emitting device, the dispersibility of the fluorescent material in the resin constituting the fluorescent member of the light emitting device can be improved.

The first calcined product has an average particle diameter D1, as measured according to the FSSS method, of 6 μm or more, preferably 6.5 μm or more, more preferably 7 μm or more, even more preferably 7.5 μm or more. The first calcined product preferably has a large average particle diameter D1, as measured according to the FSSS method, but the average particle diameter D1 of the first calcined product is generally less than 13 μm. The first calcined product has an average particle diameter D1, as measured according to the FSSS method, of preferably 12.9 μm or less. When the average particle diameter D1, as measured according to the FSSS method, of the first calcined product is 6 μm or more, the first calcined product can be a seed crystal in the second heat treatment to promote crystal growth thereof to give a second calcined product having an average particle diameter, as measured according to the FSSS method, of 13 μm or more.

Second Heat Treatment

The second mixture prepares by mixing a compound containing at least one metal element selected from the group consisting of Ba, Sr and Ca, at least one compound selected from a compound containing Mn and a compound containing Eu, a compound containing Al, and the first calcined product whose content is 10% by mass or more and 90% by mass or less relative to the total amount of the second mixture, and optionally may contain a compound containing Mg. The second mixture is subjected to second heat treatment to give a second calcined product. Preferably, the second mixture contains a compound containing Mn.

The content of the first calcined product contained in the second mixture relative to the total amount of the second mixture is preferably in a range of 15% by mass or more and 85% by mass or less, more preferably in a range of 20% by mass or more and 80% by mass or less, even more preferably in a range of 25% by mass or more and 80% by mass or less, still more preferably in a range of 30% by mass or more and 80% by mass or less.

In the second mixture, when the first calcined product having a mean particle diameter D1 of 6 μm or more is contained in a range of 10% by mass or more and 90% by mass or less relative to the total amount of the second mixture, the first calcined product can be a seed crystal in the second heat treatment to promote crystal growth to give a large second calcined product having a mean particle diameter, as measured according to the FSSS method, of 13 μm or more, and the second calcined product can be used as an aluminate fluorescent material. When the content of the first calcined product is less than 10% by mass relative to the total amount of the second mixture, the content of the first calcined product to be a seed crystal is too small to promote crystal growth in the second heat treatment, and if so, a second calcined product having a large particle diameter is difficult to obtain. When the content of the first calcined product is more than 90% by mass relative to the total amount of the second mixture, the amount of the compound to be a raw material contained in the second mixture would be relatively small so that crystal growth could not be promoted and a second calcined product having a large particle diameter could not be obtained.

In mixing the second mixture, the mixing method, the mixing machine and others exemplified in the case of producing the first mixture may be used. The second mixture may be heat-treated in a crucible, a boat of the same material as that for use for the first mixture.

The second mixture preferably contains a flux, and is subjected to second heat treatment preferably along with the flux therein to give a second calcined product.

For the second heat treatment temperature, the temperature ranges as described above for the first heat treatment temperature may apply. The second heat treatment temperature may be the same as the first heat treatment temperature mentioned above, or may differ from the latter. For the heat treatment, for example, an electric furnace or a gas furnace may be used.

For the atmosphere for the second heat treatment, the atmospheres as described above for the first heat treatment may be employed. The second heat treatment atmosphere may be the same as the first heat treatment atmosphere, or may differ from the latter.

For the time period for the second heat treatment, the time periods as described above for the first heat treatment may be employed. The second heat treatment time may be the same as the first heat treatment time, or may differ from the latter.

Post Treatment

Preferably, the first calcined product or the second calcined product obtained through the first heat treatment or the second heat treatment is post-treated to give an aluminate fluorescent material. For example, the post treatment is preferably at least one treatment selected from wet-process dispersion, wet-process screening, dewatering, drying and dry-process screening.

In the case where the calcined product is wet-dispersed or wet-screened for post treatment, specifically, the resultant calcined product is dispersed in a solvent and the dispersed second calcined product is put on a screen, and a solvent flow is applied along with various vibrations thereto via the screen so that the calcined product is led to pass through the mesh for wet-process screening. After the wet-process screening, the resultant particles may be classified through sedimentation for removing fine particles. The fine particles to be removed from the calcined product through sedimentation classification vary depending on the intended particle diameter, etc. In the case where fine particles are removed in the post-treatment from the calcined product obtained after the second heat treatment, the amount thereof is preferably approximately in a range of 15% by mass or more and 20% by mass or less relative to the total amount of the calcined product obtained after the second heat treatment. The sedimentation classification may be repeated several times. After the sedimentation classification, the resultant particles may be dewatered, dried and dry-screened to give a fluorescent material. By dispersing the calcined product after heat treatment in a solvent, impurities such as a flux calcined residue of flux as well as unreacted components of raw material may be removed. For wet-process dispersion, a solid dispersion medium such as alumina balls, zirconia balls may be used. As the solvent for the wet-process dispersion, for example, deionized water may be used. The time for the wet-process dispersion varies depending on the solid dispersion medium and the solvent to be used, but is preferably 10 minutes or more, more preferably 20 minutes or more, even more preferably 30 minutes or more, and is preferably 240 minutes or less. When the second calcined product is wet-dispersed preferably in a range of 10 minutes or more and 240 minutes or less, the dispersibility of the resultant aluminate fluorescent material can be improved.

In the case where the calcined product is dried and dry-screened as post treatment, specifically, the calcined product is dried at a temperature in a range of about 80° C. to about 150° C. or so. The dried calcined product may be led to pass through a dry-process screen to remove particles having a large particle diameter not passing through the screen. The drying time is preferably in a range of 1 hour or more and 20 hours or less, more preferably 2 hours or more and 18 hours or less.

In the case where a wet-process screen or a dry-process screen is used for post treatment, the opening of the screen is not specifically limited, and a screen having an opening corresponding to the particle diameter of the first calcined product or the second calcined product may be used.

First Calcined Product and/or Second Calcined Product

Preferably, at least one of the first calcined product and the second calcined product has a composition represented by the following formula (I):

$$X^1_p Eu_t Mg_q Mn_r Al_s O_{p+t+q+r+1.5s} \qquad (I)$$

wherein $X^1$ represents at least one element selected from the group consisting of Ba, Sr and Ca, and p, q, r, s, and t each satisfies $0.5 \leq p \leq 1.0$, $0 \leq q \leq 1.0$, $0 \leq r \leq 0.7$, $8.5 \leq s \leq 13.0$, $0 \leq t \leq 0.5$, $0.5 \leq p+t \leq 1.2$, $0.1 \leq r+t \leq 0.7$, and $0.2 \leq q+r \leq 1.0$.

The first calcined product obtained in the step of producing the first calcined product and/or the second calcined product obtained in the step of producing the second calcined product can be used as an aluminate fluorescent material.

Flux

Preferably, at least one of the first mixture and the second mixture contains a flux, and the flux is a compound containing at least one metal element selected from the group consisting of K, Na, Ba, Sr, Ca, Mg, Al and Mn. Preferably, the flux differs from the compound containing at least one metal element selected from the group consisting of Ba, Sr and Ca contained in the first mixture and/or second mixture, the above-mentioned Mn-containing compound, the above-mentioned Mg-containing compound, and the above-mentioned Al-containing compound. The flux is preferable a halide and does not contain the raw material of the first mixture or the raw material of the second mixture.

More preferably, both the first mixture and the second mixture contain a flux. In the case where both the first mixture and the second mixture contain a flux, the flux contained in the first mixture may be the same as or different from the flux contained in the second mixture.

In the case where the first mixture contains a flux, the flux promotes the reaction between the raw materials in the first mixture in the first heat treatment to attain more uniform solid-phase reaction to thereby promote crystal growth. Owing to the presence of flux, growth of the raw crystals in the first mixture can be promoted to give a first calcined product having a relatively large particle diameter. The temperature of the first heat treatment is almost the same as the temperature at which the compound used as the flux forms a liquid phase, or is higher than that temperature. It is considered that when the flux forms a liquid phase, the reaction between the raw materials in the first mixture could be promoted to attain more uniform solid-phase reaction to thereby promote crystal growth.

It is considered that, in the case where the second mixture contains a flux, the flux could promote the reaction between the first calcined product to be a seed crystal in the second mixture and the other raw materials therein, in the second heat treatment to attain more uniform solid-phase reaction to thereby promote crystal growth from the seed crystal.

The flux is preferably a halide containing at least one metal element selected from the group consisting of K, Na, Ba, Sr, Ca, Mg, Al and Mn, and examples thereof include a fluoride, a chloride containing at least one metal element selected from the group consisting of K, Na, Ba, Sr, Ca, Mg, Al and Mn. More preferably, the flux is a fluoride containing the above-mentioned metal element. Examples of the flux include KF, NaF, $BaF_2$, $SrF_2$, $CaF_2$, $MgF_2$, $AlF_3$, and $MnF_2$.

The metal element contained in the flux may be contained in the composition of the first calcined product or the second calcined product to be obtained here.

Preferably, the flux is contained in the first mixture or the second mixture in such a manner that the molar number of the metal element contained in the flux is 0.03 or more and 0.60 or less, more preferably 0.04 or more and 0.55 or less, even more preferably 0.05 or more and 0.50 or less, still more preferably 0.06 or more and 0.40 or less, when the molar number of Al contained in the first mixture not containing a flux and/or in the second mixture not containing flux is taken as 10. When the flux amount is within this range, the reaction between the raw materials in the first mixture or the reaction between the raw materials and the first calcined product in the second mixture can be promoted in the first heat treatment or the second heat treatment to attain more uniform solid-phase reaction to thereby obtain a first calcined product or a second calcined product having a large particle diameter.

In the case where the metal element contained in the flux partly constitutes the composition of the mixture for the first calcined product or the second calcined product, the flux is added to the first mixture or the second mixture in such a manner that the molar number of the metal element contained in the flux is taken within the above range, when the molar number of Al contained in the first mixture not containing a flux or in the second mixture not containing flux is taken as 10.

Preferably, the flux includes two kinds of fluxes, a first flux and a second flux. In the case where the flux includes two kinds of fluxes, preferably, the first flux is a compound containing at least one metal element of the group consisting of Ba, Sr, Ca, Mg, Al and Mn and the second flux is a compound containing at least one metal element selected from K and Na. In the case where two kinds of fluxes, the first flux and the second flux are contained, at least one of the first mixture and the second mixture may contain the two kinds of fluxes, or both the first mixture and the second mixture may contain the two kinds of fluxes.

When a compound containing a metal element that constitutes the host crystal in the first calcined product or the second calcined product is used as the first flux, impurities can be prevented from being mixed into the crystal structure and the compositional ratio (molar ratio) of the components constituting the first calcined product or the second calcined product can be controlled to be a desired molar ratio.

When a compound containing at least one metal element selected from K and Na is used as the second flux, crystal growth may become easy in the c-axial direction and/or in the in-plane direction in the hexagonal crystal structure, and therefore an aluminate fluorescent material having a high emission intensity can be obtained.

Further, when a first flux and a second flux whose melting point differs from that of the first flux are contained, crystal growth at a higher heat treatment temperature can be promoted and the particle diameter of the resultant particles can be enlarged.

In the case where two kinds of fluxes of the first flux and the second flux are contained, the molar number of the metal element contained in the first flux is preferably 0.006 or more and 0.55 or less, more preferably 0.01 or more and 0.50 or less, even more preferably 0.02 or more and 0.45 or less, still more preferably 0.03 or more and 0.40 or less, when the molar number of Al contained in the first mixture not containing a flux and/or in the second mixture not containing flux is taken as 10.

The molar number falling within the above range can promote the reaction of the raw materials in the first mixture or the reaction of the raw materials and the first calcined product in the second mixture in the first heat treatment or the second heat treatment to thereby attain more uniform solid-phase reaction, and additionally, the crystal structure of the host crystal can be thereby stabilized to give a first calcined product or a second calcined product having a large particle diameter.

In the case where the metal element contained in the first flux constitutes a part of the composition of the resultant first calcined product or the second calcined product, the flux is added to the first mixture or the second mixture in such a manner that the molar number of the metal element contained in the flux is within the range of 0.006 or more and 0.55 or less, when the molar number of Al contained in the first mixture not containing a flux or in the second mixture not containing flux is taken as 10.

In the case where the metal element contained in the first flux is Mg or Al and the metal element contained in the second flux is K or Na, a molar ratio (the molar number of the metal element contained in the first flux:the molar number of the metal element contained in the second flux) is preferably within a range of 20:1 to 1:5, more preferably within a range of 15:1 to 1:3, even more preferably within a range of 10:1 to 1:2. When the molar ratio of the metal element contained in the first flux and the metal element contained in the second flux is within a range of 20:1 to 1:5, the reaction of the raw materials in the first mixture or the reaction of the first calcined product and the raw materials in the second mixture can be promoted to attain more uniform solid-phase reaction, and additionally, the crystal structure of the host crystal can be thereby stabilized to give a first calcined product or a second calcined product having a large particle diameter. When the content of the second flux is too large, the amount of the alkali metal of Na or K which could be taken into the crystal structure would increase so that the emission intensity would adversely decrease.

Compounds Contained in First Mixture or Second Mixture

The first mixture contains a compound containing at least one metal element (alkaline earth metal element) selected from the group consisting of Ba, Sr and Ca, at least one compound of a compound containing Mn and a compound containing Eu, and a compound containing Al. The second mixture contains a compound containing at least one metal element (alkaline earth metal element) selected from the group consisting of Ba, Sr and Ca, at least one compound of a compound containing Mn and a compound containing Eu, and a compound containing Al. Optionally, the first mixture or the second mixture may further contain a compound containing Mg. Preferably, the first mixture and the second mixture contain a compound containing Mn.

Compound Containing Alkaline Earth Metal Element

The compound containing at least one alkaline earth metal element selected from the group consisting of Ba, Sr and Ca includes an oxide, a hydroxide, a carbonate, a nitrate, a sulfate, a carboxylate, a halide, and/or a nitride containing at least one alkaline earth metal element selected from the group consisting of Ba, Sr and Ca. These compounds may be in the form of a hydrate. Specifically, the compound includes BaO, Ba(OH)hd 2.8H$_2$O, BaCO$_3$, Ba(NO$_3$)$_2$, BaSO$_4$, Ba(HCOO)$_2$, Ba(OCOCH$_3$)$_2$, BaCl$_2$.6H$_2$O, Ba$_3$N$_2$, SrO, Sr(OH)$_2$.8H$_2$O, SrCO$_3$, Sr(NO$_3$)$_2$.4H$_2$O, SrSO$_4$, Sr(HCOO)$_2$.2H$_2$O, Sr(OCOCH$_3$)$_2$.5H$_2$O, SrCl$_2$.6H$_2$O, Sr$_3$N$_2$, CaO, Ca(OH)$_2$, CaCO$_3$, Ca(NO$_3$)$_2$, CaSO$_4$, CaCl$_2$, Ca$_3$N$_2$, etc. One alone or two or more of these compounds may be used either singly or in combination. Among these, carbonates and oxides are preferred from the viewpoint of easy handleability. A carbonate containing at least one alkaline earth metal element selected from the group consisting of Ba, Sr and Ca is more preferred, since the stability thereof in air is good, it can be easily decomposed by heating, elements except the intended composition hardly remain, and the emission intensity can be readily prevented from being lowered by residual impurity elements.

Mn-Containing Compound

The Mn-containing compound includes an oxide, a hydroxide, a carbonate, a nitrate, a sulfate, a carboxylate, a halide, and/or a nitride containing Mn. These manganese-containing compounds may be in the form of a hydrate. Specifically, the compound includes MnO$_2$, Mn$_2$O$_2$, Mn$_3$O$_4$, MnO, Mn(OH)$_2$, MnCO$_3$, Mn(NO$_3$)$_2$, Mn(OCOCH$_3$)$_2$.2H$_2$O, Mn(OCOCH$_3$)$_3$.2H$_2$O, MnCl$_2$.4H$_2$O, etc. One alone or two or more of the Mn-containing compounds may be used either singly or in combination. Among these, carbonates and oxides are preferred from the viewpoint of easy handleability. A carbonate containing Mn (e.g. MnCO$_3$) is more preferred. Since the stability in air is good, it can be easily decomposed by heating, elements except the intended composition hardly remain, and the emission intensity can be readily prevented from being lowered by residual impurity elements.

Eu-Containing Compound

The Eu-containing compound includes an oxide, a hydroxide, a carbonate, a nitrate, a sulfate, a halide, and/or a nitride containing Eu. These Eu-containing compounds may be in the form of a hydrate. Specifically, the compound includes EuO, Eu$_2$O$_3$, Eu(OH)$_3$, Eu$_2$(CO$_3$)$_3$, Eu(NO$_3$)$_3$, Eu$_2$(SO$_4$)$_3$, EuCl$_2$, EuF$_3$, etc. One alone or two or more of the Eu-containing compounds may be used either singly or in combination. Among these, carbonates and oxides are preferred from the viewpoint of easy handleability. An oxide containing Eu (Eu$_2$O$_3$) is more preferred. Since the stability in air is good, it can be easily decomposed by heating, elements except the intended composition hardly remain, and the emission intensity can be readily prevented from being lowered by residual impurity elements.

Al-Containing Compound

The Al-containing compound includes an oxide, a hydroxide, a nitride, an oxynitride, a fluoride, and/or a chloride containing Al. These compounds may be in the form of a hydrate. As the Al-containing compound, an aluminum metal elemental substance or an aluminum alloy may be used, and a metal elemental substance or an alloy may be used in place of at least a part of the compound.

Specifically, the Al-containing compound includes Al$_2$O$_3$, Al(OH)$_3$, AlN, AlF$_3$, AlCl$_3$, etc. One alone or two or more of the Al-containing compounds may be used either singly or in combination. The Al-containing compound is preferably an oxide ($Al_2O_3$). This is because, differing from other materials, the oxide does not contain any other element than the intended composition of an aluminate fluorescent material, and a fluorescent material having an intended composition is easy to obtain. In the case where a compound containing some other element than the intended composition is used, residual impurity elements may remain in the resultant fluorescent material, and the residual impurity elements may be killer elements against light emission to extremely low emission intensity.

Mg-Containing Compound

The Mg-containing compound includes an oxide, a hydroxide, a carbonate, a nitrate, a sulfate, a carboxylate, a halide, and/or a nitride containing Mg. These magnesium-containing compounds may be in the form a hydrate. Specifically, the compound includes MgO, $Mg(OH)_2$, $3MgCO_3.Mg(OH)_2.3H_2O$, $MgCO_3.Mg(OH)_2$, $Mg(NO_3)_2.6H_2O$, $MgSO_4$, $Mg(HCOO)_2.2H_2O$, $Mg(OCOCH_3)_2.4H_2O$, $MgCl_2$, $Mg_3N_2$, etc. One alone or two or more of the Mg-containing compounds may be used either singly or in combination. Among these, carbonates and oxides are preferred from the viewpoint of easy handleability. An oxide containing Mg (MgO) is more preferred. Since the stability in air is good, it can be easily decomposed by heating, elements except the intended composition hardly remain, and the emission intensity can be readily prevented from being lowered by residual impurity elements.

Aluminate Fluorescent Material

The aluminate fluorescent material of the second embodiment of the present disclosure has an average particle diameter D2 (Fisher Sub-Sieve Sizer's Number), as measured according to the FSSS (Fisher Sub-Sieve Sizer) method, of 13 µm or more and/or a volume-average particle diameter Dm2, as measured according to a laser diffraction scattering particle size distribution measuring method, of 20 µm or more, and preferably has a composition represented by the following formula (I). The volume-average particle diameter Dm2 means a 50% volume particle diameter in the particle size distribution measured according to a laser diffraction scattering particle size distribution measuring method.

$$X^1_p Eu_t Mg_q Mn_r O_{p+t+q+r+1.5s} \quad (I)$$

wherein $X^1$ represents at least one element selected from the group consisting of Ba, Sr and Ca, and p, q, r, s, and t each satisfies $0.5 \leq p \leq 1.0$, $0 \leq q \leq 1.0$, $0 \leq r \leq 0.7$, $8.5 \leq s \leq 13.0$, $0 \leq t \leq 0.5$, $0.5 \leq p+t \leq 1.2$, $0.1 \leq r+t \leq 0.7$, and $0.2 \leq q+r \leq 1.0$.

The aluminate fluorescent material having the composition represented by the formula (I) (hereinafter also referred to as "aluminate fluorescent material (I)") has an average particle diameter D2, as measured according to the FSSS (Fisher Sub-Sieve Sizer) method, of 13 µm or more or has a volume-average particle diameter Dm2, as measured according to a laser diffraction scattering particle size distribution measuring method, of 20 µm or more, and thus has a large particle diameter and has a high emission intensity. The aluminate fluorescent material (I) is preferably one produced according to the above-mentioned aluminate fluorescent material production method.

The average particle diameter D2, as measured according to the FSSS method, of the aluminate fluorescent material (I) is preferably 14 µm or more, more preferably 15 µm or more. The average particle diameter D2 is, for example, 50 µm or less. The aluminate fluorescent material (I) having a large average particle diameter D2 has a high emission intensity.

The volume-average particle diameter (Dm2), as measured according to a laser diffraction scattering particle size distribution measuring method, of the aluminate fluorescent material (I) is preferably 20.5 µm or more, more preferably 21 µm or more, even more preferably 22 µm or more. The volume-average particle diameter Dm2 is 100 µm or less, for example, less than 80 µm. The volume-average particle diameter Dm2 is preferably 50 µm or less. The aluminate fluorescent material (I) having a large volume-average particle diameter Dm2 has a high emission intensity. The laser diffraction scattering particle size distribution measuring method is a method of measuring a particle size irrespective of primary particles and secondary particles by using the scattered light from the laser light radiated to particles.

Preferably, the dispersion degree Dm2/D2 of the aluminate fluorescent material (I), defined as the ratio of the volume-average particle diameter Dm2 to the average particle diameter D2, is in a range of 1.0 or more and less than 1.6. The dispersion degree Dm2/D2 indicates the particle size relative to primary particles, as measured irrespective of primary particles and secondary particles, and when the value of the dispersion degree Dm2/D2 is larger, the amount of the secondary particles contained in the aluminate fluorescent material (I) is larger. When the value of the dispersion degree Dm2/D2 is nearer to 1, the amount of secondary particles is smaller.

The dispersion degree Dm2/D2 can be an index that indicates, when the aluminate fluorescent material (I) is used in a light emitting device, the dispersibility of the material in a fluorescent member to be mentioned below, or the dispersibility in a resin-containing fluorescent member composition to constitute a fluorescent member to be mentioned below. An aluminate fluorescent material (I) having a higher value of the dispersion degree Dm2/D2 tends to have a higher apparent density of powder of the aluminate fluorescent material (I), and when the aluminate fluorescent material (I) is used in a light emitting device, the filling density in the fluorescent member to be mentioned below tends to be higher. When the dispersion degree Dm2/D2 of the aluminate fluorescent material (I) is less than 2.0, the emission intensity tends to be somewhat lower with the decrease in the value of the dispersion degree Dm2/D2. When the dispersion degree Dm2/D2 is in a range of 1.0 or more and less than 1.6, the light emitting device using the aluminate fluorescent material (I) whose dispersion degree Dm2/D2 falls in the range would paradoxically have an increased luminous flux. This is presumed to be because the aluminate fluorescent material (I) whose dispersion degree Dm2/D2 falls in the above range can exhibit good dispersibility in a fluorescent member in a light emitting device, and therefore the efficiency of emitting light from the light emitting device could be improved. The dispersion degree Dm2/D2 of the aluminate fluorescent material (I) is more preferably in a range of 1.0 or more and 1.5 or less.

An aluminate fluorescent material (I) whose a dispersion degree Dm2/D2 falls in a range of 1.0 or more and less than 1.6 may be controlled in point of the time for wet-process dispersion, for example, in the dispersion step for the first calcined product and/or in the post treatment step for the second calcined product, giving an aluminate fluorescent material (I) having the dispersion degree Dm2/D2 in a range of 1.0 or more and less than 1.6. The time for wet-process dispersion for obtaining an aluminate fluorescent material (I) having a preferred the dispersion degree Dm2/D2 varies depending on the solvent or the solid dispersion medium to be used for wet-process dispersion. For example, when deionized water is used as the solvent and alumina balls are used as the solid dispersion medium, the time for wet-process dispersion for obtaining an aluminate fluorescent material (I) having the dispersion degree Dm2/D2 in a range of 1.0 or more and less than 1.6 is preferably 30 minutes or more, more preferably 60 minutes or more, even more preferably 90 minutes or more, still more preferably 120 minutes or more. The time for wet-process dispersion is, in consideration of production efficient, preferably 420 minutes or less.

Regarding the aluminate fluorescent material (I), the particle diameter ratio of the 90% volume particle diameter D90 to the 10% volume particle diameter D10, as cumulated from the small diameter side in the particle size distribution according to a laser diffraction scattering particle size distribution measuring method, D90/D10 is preferably 3.0 or less. The particle diameter ratio of 90% volume particle diameter D90 to 10% volume particle diameter D10, D90/D10 is also an index indicating the degree of dispersion in volume-based particle size distribution. When the particle diameter ratio D90/D10 of the aluminate fluorescent material (I) is 3.0 or less, it means that the size of individual aluminate fluorescent material (I) particles fluctuate little and the particles have a relatively uniform size. When the particle diameter ratio D90/D10 is 3.0 or less, the size of individual aluminate fluorescent material (I) particles fluctuate little and the particles have a relatively uniform size, and if so, therefore, the dispersibility of the aluminate fluorescent material (I) in a fluorescent member is good and the luminous flux achievable by a light emitting device can be large.

The aluminate fluorescent material of the third embodiment of the present disclosure has an average circle-equivalent diameter Dc of 13 μm or more, and has a composition represented by the formula (I).

The aluminate fluorescent material (I) has an average circle-equivalent diameter Dc of 13 μm or more, and therefore has a large particle diameter and has a high emission intensity. Preferably, the aluminate fluorescent material (I) is one produced according to the above-mentioned aluminate fluorescent material production method. The average circle-equivalent diameter Dc of the aluminate fluorescent material (I) is preferably 13.5 μm or more, more preferably 14 μm or more. The average circle-equivalent diameter Dc of the aluminate fluorescent material (I) may be 30 μm or less.

In this description, the circle-equivalent diameter is a value measured as follows. A SEM image of the aluminate fluorescent material taken using a scanning electron microscope (SEM) is analyzed using an image analyzing software (for example, WinROOF2013, manufactured by Mitani Corporation), and on the SEM image on which fluorescent material particles having a particle diameter of 1 μm or less are excluded, 20 or more aluminate fluorescent particles that can be individually identified in point of the contour thereof are binarized. The range of the particle diameter that can be identified on the SEM image means a longest diameter of the image. Regarding the sample of the binarized 20 or more particles, the binarized particle shape is estimated as a circle, and the diameter of a precise circle having the same area as that of the estimated circle is referred to as a circle-equivalent diameter. An average value Av of the particle size distribution of the circle-equivalent diameter of the sample of the measured 20 or more particles and a standard deviation σ thereof are calculated, and the circle-equivalent diameter of a numerical value not satisfying a numerical value of (average value Av−standard deviation σ) or more and a numerical value of (average value Av+standard deviation σ) or less is excluded, and the mathematical average value of the circle-equivalent diameter of the remaining sample particles is referred to as an average circle-equivalent diameter Dc.

In the formula (I), $X^1$ preferably contains Ba. When $X^1$ in the formula (I) representing the composition of the aluminate fluorescent material (I) contains Ba, the emission intensity can be high.

The subscript p in the formula (I) indicates the total molar ratio of at least one element selected from the group consisting of Ba, Sr and Ca. In the formula (I), when the subscript p does not satisfy $0.5 \leq p \leq 1.0$, the crystal structure of the aluminate fluorescent material (I) may be unstable and the emission intensity may lower. The subscript p is preferably 0.60 or more, more preferably 0.80 or more. The subscript p may be 0.99 or less.

In the formula (I), the subscript q indicates a molar ratio of Mg, and when the subscript q is more than 1.0, the molar ratio of Mg is high so that the amount of Mn or Eu to be an activating element is relatively small and the relative emission intensity would tend to lower. The aluminate fluorescent material (I) may not contain Mg. The subscript q in the formula (I) preferably satisfies $0 < q \leq 0.7$, more preferably $0 < q \leq 0.6$. The lower limit of the subscript q in the formula (I) is more preferably 0.05, even more preferably 0.1. In the formula (I) representing the composition of the aluminate fluorescent material (I), when subscript q satisfies $0 \leq q \leq 1.0$, the emission spectrum through photoexcitation in a near UV to blue region has an emission peak wavelength in a range of 510 nm or more and 525 nm or less, and the reflection ratio tends to be relatively low and the emission intensity tends to be high.

The subscript r in the formula (I) indicates a molar ratio of Mn. Mn is an activating element in the aluminate fluorescent material (I). Preferably, the aluminate fluorescent material (I) contains at least one of Mn and Eu as an activating element, more preferably Mn. In addition to Mn, the aluminate fluorescent material (I) may further contain a rare earth element such as Eu, Ce, etc. In particular, when the aluminate fluorescent material (I) contains Mn and Eu as activating elements, it is expected that Eu may absorb light to excite electrons and the resultant excitation energy may be transmitted from Eu to Mn, therefore further contributing toward emission by Mn. Consequently, owing to photoexcitation in a near UV to blue region, the emission intensity of the aluminate fluorescent material (I) can be increased. The subscript r in the formula (I) indicates a molar ratio of Mn, and in the case where the subscript r is more than 0.7, the activation amount of Mn is too much and, if so, the aluminate fluorescent material (I) undergoes concentration quenching and the emission intensity would be thereby lowered. In the formula (I), the subscript r preferably satisfies $0.2 \leq r \leq 0.7$, more preferably $0.4 \leq r \leq 0.6$. In the formula (I), the subscript r is more preferably 0.45 or more, and more preferably 0.55 or less.

The subscript t in the formula (I) indicates a molar ratio of Eu. Eu is an activating element of the aluminate fluorescent material (I). When the subscript t is more than 0.5, the emission intensity tends to lower. The subscript t in the formula (I) preferably satisfies $0.1 \leq t \leq 0.5$, more preferably $0.2 \leq t \leq 0.4$.

The total value of the subscript p and the subscript t in the formula (I) (hereinafter also referred to as "subscripts p+t") indicates a total molar ratio of the alkaline earth metal element and Eu, and when the subscripts p+t are less than 0.5 or more than 1.2, the crystal structure of the aluminate fluorescent material (I) tends to be unstable and the emission intensity may therefore lower. The subscripts p+t are preferably 0.55 or more, more preferably 0.60 or more. The subscripts p+t are preferably 1.10 or less, more preferably 1.05 or less.

The total of the subscript r and the subscript t in the formula (I) (hereinafter also referred to as "subscripts r+t") is a total molar ratio of activating elements, Mn and Eu; and when the subscripts r+t are more than 0.7, and for example, when the aluminate fluorescent material (I) is excited by light in a near UV to blue region, the reflection ratio may be high and the emission intensity tends to lower. In the formula (I), when the subscripts r+t are less than 0.1, the activation amount is small and, if so, when the aluminate fluorescent material (I) is excited with light falling in a near UV to blue region, light absorption is small and the emission intensity would be difficult to increase.

The total of the subscript q and the subscript r in the formula (I) (hereinafter also referred to as "subscripts q+r") indicates a number satisfying $0.2 \leq q+r \leq 1.0$. When the subscripts q+r are less than 0.2 or more than 1, sufficient relative emission intensity could not be obtained. The subscripts q+r are preferably 0.3 or more, more preferably 0.4 or more, and are preferably 0.99 or less, more preferably 0.98 or less.

The subscript s in the formula (I) indicates a molar ratio of Al, and when the subscript s is less than 8.5 or more than 13, the crystal structure may be unstable, and if so, when the aluminate fluorescent material (I) is excited with light falling in a near UV to blue region, the emission intensity tends to lower. In the formula (I), the subscript s is preferably a number satisfying $9.0 \leq s \leq 13.0$. In the formula (I), the subscript s is more preferably 12.0 or less, even more preferably 11.0 or less.

Preferably, the aluminate fluorescent material (I) having an average particle diameter D2 of 13 μm or more or a volume-average particle diameter Dm2 of 20 μm or more is produced according to the production method of the first embodiment of the present disclosure. For the aluminate fluorescent material (I), in the case where a compound containing at least one metal element selected from K and Na is used as the second flux in the production method according to the first embodiment, a minor amount of at least one metal element selected from K and Na may be detected from the aluminate fluorescent material (I). Even in such a case, the composition of the aluminate fluorescent material (I) satisfies the formula (I).

The aluminate fluorescent material (I) is activated by manganese (Mn) to emit green owing to photoexcitation in a near UV to blue region. Specifically, the aluminate fluorescent material (I) absorbs light of a wavelength in a range of 380 nm or more and 485 nm or less and emits light having an emission spectrum in which the peak emission wavelength is preferably in a range of 485 nm or more and 570 nm or less, more preferably in a range of 505 nm or more and 550 nm or less, further preferably in a range of 515 nm or more and 523 nm or less.

Light Emitting Device

An example of a light emitting device using the aluminate fluorescent material (I) according to the first embodiment of the present disclosure is described with reference to the drawing attached hereto. FIG. 1 is a schematic cross-sectional view showing a light emitting device 100 according to the third embodiment of the present disclosure.

The light emitting device 100 includes a molded article 40, a light emitting element 10 and a fluorescent member 50. The molded article 40 is integrally comprises of a first lead 20, a second lead 30 and a resin part 42 containing a thermoplastic resin or a thermosetting resin. The molded article 40 forms a recess part having a bottom face and a side face, and the light emitting element 10 is mounted on the bottom face of the recess part. The light emitting element 10 has a pair of positive and negative electrodes, and the pair of positive and negative electrodes each are individually electrically connected to the first lead 20 and the second lead 30 each via a wire 60. The light emitting element 10 is covered with the fluorescent member 50. The fluorescent member 50 contains, for example, a fluorescent material 70 for wavelength conversion of the light from the light emitting element 10, and a resin. Further, the fluorescent material 70 contains a first fluorescent material 71 and a second fluorescent material 72. The first lead 20 and the second lead 30 connected to the pair of positive and negative electrodes of the light emitting element 10 are partly exposed toward the outside of the package to constitute the light emitting device 100. Via these first lead 20 and second lead 30, the light emitting device 100 receives external power to emit light.

The light emitting element 10 is used as an excitation light source, and preferably has an emission peak within a wavelength range of 380 nm or more and 485 nm or less. The range of the emission peak wavelength of the light emitting element 10 is preferably in a range of 390 nm or more and 480 nm or less, more preferably in a range of 420 nm or more and 470 nm or less. The aluminate fluorescent material is efficiently excited by the light from the excitation light source having an emission spectrum within a range of 380 nm or more and 485 nm or less, and using an aluminate fluorescent material having a high emission intensity, the light emitting device 100 that can emit mixed light of the light from the light emitting element 10 and the fluorescence from the fluorescent material 70 can be constructed.

The full width at half maximum of the emission spectrum of the light emitting element 10 is, for example, 30 nm or less. Preferably, for example, the light emitting element 10 uses a semiconductor light emitting element using a nitride semiconductor ($In_XAl_YGa_{1-X-Y}N$, $0 \leq X$, $0 \leq Y$, $X+Y \leq 1$). Using the semiconductor light emitting element as a light source, a stable light emitting device having a high efficiency and a high linearity of output to input and having high mechanical impact resistance can be obtained.

The light emitting device 100 is provided with at least the aluminate fluorescent material (I) of the second embodiment of the present disclosure, and an excitation light source having an emission peak wavelength in a range of 380 nm or more and 485 nm or less.

The first fluorescent material 71 contains the aluminate fluorescent material (I) of the second embodiment of the present disclosure and can be contained, for example, in the fluorescent member 50 to cover the light emitting element 10. In the light emitting device 100 in which the light emitting element 10 is covered by the fluorescent member 50 that contains the first fluorescent material 71, a portion of light emitted from the light emitting element 10 is absorbed by the aluminate fluorescent material and re-emitted as green light. Within use of light emitting element 10 configured to emits light having an emission peak wavelength in a range of 380 nm or more and 485 nm or less, a light emitting device having a high emission efficiency can be provided.

The content of the first fluorescent material 71 may be, for example, in a range of 10 parts by mass or more and 200 parts by mass or less relative to 100 parts by mass of the resin, and is preferably in a range of 2 parts by mass or more and 40 parts by mass or less.

Preferably, the fluorescent member 50 contains the second fluorescent material 72 whose emission peak wavelength differs from that of the first fluorescent material 71. For example, the light emitting device 100 is provided with the light emitting element 10 that emits light having an emission peak wavelength in a range of 380 nm or more and 485 nm or less, and adequately the first fluorescent material 71 and the second fluorescent material 72 to be excited by the light, and consequently, the light emitting device 100 can have a broad color reproducibility range and good color rendering properties.

The second fluorescent material 72 can absorb light emitted from the light emitting element 10 and convert it to light having a wavelength different from that of the first fluorescent material 71. Examples thereof include $(Ca,Sr,Ba)_2SiO_4$:Eu, $(Ca,Sr,Ba)_8MgSi_4O_{16}(F,Cl,Br)_2$:Eu, $Si_{6-z}Al_zO_zN_{8-z}$:Eu$(0<z\leq4.2)$, $(Sr,Ba,Ca)Ga_2S_4$:Eu, $(Lu,Y,Gd,Lu)_3(Ga,Al)_5O_{12}$:Ce, $(La,Y,Gd)_3Si_6N_{11}$:Ce, $Ca_3Sc_2Si_3O_{12}$:Ce, $CaSc_4O_4$:Ce, $K_2(Si,Ge,Ti)F_6$:Mn, $(Ca,Sr,Ba)_2Si_5N_8$:Eu, $CaAlSiN_3$:Eu, $(Ca,Sr)AlSiN_3$:Eu, $(Sr,Ca)LiAl_3N_4$:Eu, $(Ca,Sr)_2Mg_2Li_2Si_2N_6$:Eu, $3.5MgO.0.5MgF_2.GeO_2$:Mn, etc.

In the case where the fluorescent member 50 further contains the second fluorescent material 72, the second fluorescent material 72 is preferably a red fluorescent material to emit a red color, and preferably absorbs light in a wavelength range of 380 nm or more and 485 nm or less, and emits light in a wavelength range of 610 nm or more and 780 nm or less. Containing the red fluorescent material, the light emitting device can be more favorably applied to lighting systems, liquid crystal display devices, etc.

The red fluorescent material includes a Mn-activated fluorescent material having a compositional formula represented by $K_2SiF_6$:Mn, $3.5MgO.0.5MgF_2.GeO_2$:Mn, a Eu-activated nitride fluorescent material represented by $CaSiAlN_3$:Eu, $(Ca,Sr)AlSiN_3$:Eu, $SrLiAl_3N_4$:Eu, etc. Among these, the red fluorescent material is, from the viewpoint of increasing the color purity and broadening the color reproducibility range, preferably a Mn-activated fluoride fluorescent material of such that the full width at half maximum of the emission spectrum thereof is 20 nm or less.

The first fluorescent material 71 and the second fluorescent material 72 (the two may be simply referred to as "fluorescent material 70" as combined), along with a sealant material, constitute the fluorescent member 50 that covers the light emitting element. The sealant material to constitute the fluorescent member 50 includes a thermosetting resin such as a silicone resin, an epoxy resin, etc.

EXAMPLES

The present invention will now be described in detail with reference to examples, but the present invention is not limited to these examples.

Production Example 1

A first mixture was prepared in a blending molar ratio to give a composition represented by $Ba_{1.0}Mg_{0.45}Mn_{0.5}Al_{10}O_{16.95}$. As raw materials $BaCO_3$, $Al_2O_3$, MgO and $MnCO_3$ were used, and the raw materials were mixed in a molar ratio shown in Table 1 to prepare the first mixture. $MgF_2$ as a first flux and NaF as a second flux was added to the first mixture. $MgF_2$ as the first flux and NaF as the second flux were so added to the first mixture that the molar number of Mg contained in the first flux and the molar number of Na contained in the second flux could be those shown in Table 1, relative to the molar number, 10 of Al contained in the flux-free first mixture. The first mixture containing the first flux and the second flux was charged in an alumina crucible, covered with a lid, and subjected to first heat treatment at 1,500° C. for 5 hours in a reductive atmosphere composed of 3% by volume of $H_2$ and 97% by volume of $N_2$ to give a first calcined product 1.

Production Examples 2 to 21

Each first mixture was prepared by mixing the raw materials in a molar ratio shown in Table 1. As a compound containing Eu, $Eu_2O_3$ was used. As the first flux, at least one selected from $MgF_2$ or $AlF_3$ was used, and as the second flux, at least one selected from NaF and KF was used. First calcined products 2 to 21 were produced in the same manner as in Example 1 except that each first mixture prepared herein was used.

Measurement of Average Particle Diameter (D1)

Using Fisher Sub-Sieve Sizer Model 95 (manufactured by Fisher Scientific Inc.), the first calcined products 1 to 21 were individually sampled in an amount of 1 cm$^3$ in an environment at a temperature of 25° C. and a humidity of 70% RH, and packed in a special tubular container, then a dry air flow was introduced under a constant pressure to read the specific surface area of the sample from the differential pressure, and the average particle diameter D1 according to the FSSS method thereof was calculated. The results are shown in Table 1.

TABLE 1

| | No. of First Calcined Product | Flux Contained In First Mixture | | | | First Calcined Product Blending Molar Ratio (mol) | | | | | Average Particle Diameter D1 (FSSS) |
|---|---|---|---|---|---|---|---|---|---|---|---|
| | | First Flux Molar Number (mol) | | Second Flux Molar Number (mol) | | | | | | | |
| | | Mg | Al | Na | K | Ba | Eu | Mg | Mn | Al | μm |
| Production Example 1 | 1 | 0.100 | — | 0.050 | — | 1.00 | — | 0.45 | 0.50 | 10.00 | 11.6 |
| Production Example 2 | 2 | 0.100 | — | 0.050 | — | 1.00 | — | 0.50 | 0.50 | 10.00 | 10.4 |
| Production Example 3 | 3 | 0.100 | — | — | 0.050 | 1.00 | — | 0.50 | 0.50 | 10.00 | 11.4 |
| Production Example 4 | 4 | — | 0.067 | 0.050 | — | 1.00 | — | — | 0.50 | 10.00 | 9.8 |
| Production Example 5 | 5 | 0.100 | — | 0.050 | — | 0.90 | 0.10 | 0.50 | 0.50 | 10.00 | 11.2 |
| Production Example 6 | 6 | — | — | — | 0.050 | 1.00 | — | 0.50 | 0.50 | 10.00 | 9.2 |
| Production Example 7 | 7 | 0.010 | — | — | 0.050 | 1.00 | — | 0.50 | 0.50 | 10.00 | 10.8 |
| Production Example 8 | 8 | 0.050 | — | — | 0.050 | 1.00 | — | 0.50 | 0.50 | 10.00 | 11.0 |
| Production Example 9 | 9 | 0.300 | — | — | 0.050 | 1.00 | — | 0.50 | 0.50 | 10.00 | 11.2 |
| Production Example 10 | 10 | 0.500 | — | — | 0.050 | 1.00 | — | 0.50 | 0.50 | 10.00 | 10.2 |

TABLE 1-continued

| No. of First Calcined Product | Flux Contained In First Mixture | | | | First Calcined Product Blending Molar Ratio (mol) | | | | | Average Particle Diameter D1 (FSSS) μm |
|---|---|---|---|---|---|---|---|---|---|---|
| | First Flux Molar Number (mol) | | Second Flux Molar Number (mol) | | | | | | | |
| | Mg | Al | Na | K | Ba | Eu | Mg | Mn | Al | |
| Production Example 11 | 11 | 0.100 | — | — | 0.005 | 1.00 | — | 0.50 | 0.50 | 10.00 | 7.5 |
| Production Example 12 | 12 | 0.100 | — | — | 0.010 | 1.00 | — | 0.50 | 0.50 | 10.00 | 8.6 |
| Production Example 13 | 13 | 0.100 | — | — | 0.030 | 1.00 | — | 0.50 | 0.50 | 10.00 | 11.2 |
| Production Example 14 | 14 | 0.100 | — | — | 0.060 | 1.00 | — | 0.50 | 0.50 | 10.00 | 11.8 |
| Production Example 15 | 15 | 0.100 | — | — | 0.070 | 1.00 | — | 0.50 | 0.50 | 10.00 | 11.6 |
| Production Example 16 | 16 | 0.100 | — | — | 0.100 | 1.00 | — | 0.50 | 0.50 | 10.00 | 11.6 |
| Production Example 17 | 17 | 0.100 | — | 0.010 | — | 1.00 | — | 0.50 | 0.50 | 10.00 | 8.1 |
| Production Example 18 | 18 | 0.100 | — | 0.030 | — | 1.00 | — | 0.50 | 0.50 | 10.00 | 10.6 |
| Production Example 19 | 19 | 0.100 | — | 0.100 | — | 1.00 | — | 0.50 | 0.50 | 10.00 | 10.4 |
| Production Example 20 | 20 | 0.020 | — | — | — | 1.00 | — | 0.50 | 0.50 | 10.00 | 3.6 |
| Production Example 21 | 21 | 0.100 | — | — | — | 1.00 | — | 0.50 | 0.50 | 10.00 | 5.4 |

As shown in Table 1, the first calcined products 1 to 19 of Production Examples 1 to 19 had an average particle diameter D1 measured according to the FSSS method of 6 μm or more. On the other hand, the first calcined products 20 and 21 of Production Examples 20 and 21 had an average particle diameter D1 of less than 6 μm.

Examples 1 to 7

The first calcined product 1, $BaCO_3$, MgO, $MnCO_3$, and $Al_2O_3$ in such a manner that the blending molar ratio could give a composition represented by $Ba_{1.0}Mg_{0.45}Mn_{0.5}Al_{10}O_{16.95}$ as shown in Table 2 were mixed in the given amount to prepare a second mixture. The content of the first calcined product in each Example shown in Table 2 is in terms of mass % relative to 100% by mass of the second mixture. Further, $MgF_2$ as a first flux and NaF as a second flux were added to the second mixture in such a manner that the molar number of Mg in the first flux and the molar number of Na in the second flux are values as shown in Table 2 when the molar number of Al contained in the flux-free second mixture is taken as 10. The second mixture containing the first flux and the second flux was charged in an alumina crucible, covered with a lid, and subjected to second heat treatment at 1,500° C. for 5 hours in a reductive atmosphere composed of 3% by volume of $H_2$ and 97% by volume of $N_2$ to give a calcined product. Using alumina balls as a solid dispersion medium, the calcined product was dispersed in deionized water in a polyethylene container for 30 minutes, then crude particles were removed therefrom through wet-process screening using a mesh having an opening of 48 μm, and 15% by mass to 20% by mass of particles on the small particle side of the calcined product obtained through sedimentation classification were removed, and the residue was dewatered and dried to give each second calcined product of an aluminate fluorescent material of Examples 1 to 7.

Comparative Example 1

In Comparative Example 1, the second mixture was not prepared, and the second heat treatment was omitted. In this, the first calcined product 1 is an aluminate fluorescent material.

Comparative Example 2

A second calcined product of an aluminate fluorescent material of Comparative Example 2 was produced in the same manner as in Example 1 except that, in Comparative Example 2, the second mixture was not prepared and the first calcined product 1 was subjected to second heat treatment. The blending molar ratio of the second calcined product in Comparative Example 2 shown in Table 2 is the same as the blending molar ratio of the first calcined product 1 of Production Example 1 in Table 1.

Comparative Example 3

In Comparative Example 3, the second mixture was not prepared, and the second heat treatment was omitted. In this, the first calcined product 2 is an aluminate fluorescent material.

Example 8

In Example 8, the first calcined product 2 was used, and further $BaCO_3$, MgO, $MnCO_3$, $Al_2O_3$ were used. The first calcined product 2 and the raw materials were mixed in a blending molar ratio to give a composition of $Ba_{1.0}Mg_{0.45}Mn_{0.5}Al_{10}O_{16.95}$ shown in Table 2, thereby preparing a second mixture. The content of the first calcined product in this Example shown in Table 2 is in terms of mass % relative to 100% by mass of the second mixture. In the same manner as in Example 2 except that this second mixture was used, a second calcined product of an aluminate fluorescent material of Example 8 was produced.

Comparative Example 4

In Comparative Example 4, the first calcined product 20 was used and further $BaCO_3$, MgO, $MnCO_3$, $Al_2O_3$ were used, and the first calcined product 20 and the raw materials were mixed in a blending molar ratio to give a composition of $Ba_{1.0}Mg_{0.45}Mn_{0.5}Al_{10}O_{16.95}$ shown in Table 2, thereby preparing a second mixture. In the same manner as in Example 2 except that this second mixture was used, a second calcined product of an aluminate fluorescent material of Comparative Example 4 was produced.

Comparative Example 5

In Comparative Example 5, the first calcined product 21 was used and further $BaCO_3$, MgO, $MnCO_3$, $Al_2O_3$ were used, and the first calcined product 21 and the raw materials were mixed in a blending molar ratio to give a composition of $Ba_{1.0}Mg_{0.45}Mn_{0.5}Al_{10}O_{16.95}$ shown in Table 2, thereby preparing a second mixture. The content of the first calcined product in this Example shown in Table 2 is in terms of mass % relative to 100% by mass of the second mixture. In the same manner as in Example 2 except that this second mixture was used, a second calcined product of an aluminate fluorescent material of Comparative Example 5 was produced.

Comparative Example 6

In Comparative Example 6, the second mixture was not prepared, and the second heat treatment was omitted. In this, the first calcined product 3 is an aluminate fluorescent material.

Example 9

In Example 9, the first calcined product 3 was used, and further $BaCO_3$, MgO, $MnCO_3$, $Al_2O_3$ were used. The first calcined product 3 and the raw materials were mixed in a blending molar ratio to give a composition of $Ba_{1.0}Mg_{0.45}Mn_{0.5}Al_{10}O_{16.95}$ shown in Table 2, thereby preparing a second mixture. The content of the first calcined product in this Example shown in Table 2 is in terms of mass % relative to 100% by mass of the second mixture. In the same manner as in Example 2 except that this second mixture was used, a second calcined product of an aluminate fluorescent material of Example 9 was produced.

Comparative Example 7

In Comparative 7, the second mixture was not prepared, and the second heat treatment was omitted. In this, the first calcined product 4 is an aluminate fluorescent material.

Examples 10, 11, 12

In Examples 10, 11 and 12, the first calcined product 4 was used, and further $BaCO_3$, $MnCO_3$, $Al_2O_3$ were used. The first calcined product 4 and the raw materials were mixed in a blending molar ratio to give a composition of $Ba_{1.0}Mn_{0.5}Al_{10}O_{16.5}$ shown in Table 2, thereby preparing a second mixture. The content of the first calcined product in each Example shown in Table 2 is in terms of mass % relative to 100% by mass of the second mixture. In the same manner as in Example 1, except that $AlF_3$ as a first flux and NaF as a second flux were used and these were added in such a manner that molar number of Al in the first flux and the molar number of Na in the second flux could be those shown in Table 2 relative to the molar number, 10 of Al in the second mixture not containing the first flux of $AlF_3$ and the second flux of NaF, a second calcined product of an aluminate fluorescent material of each of Examples 10, 11 and 12 was produced.

Comparative Example 8

A second calcined product of an aluminate fluorescent material of Comparative Example 8 was produced in the same manner as in Comparative Example 2, except that, in Comparative Example 8, the second mixture was not prepared and the first calcined product 4 was subjected to second heat treatment. The blending molar ratio of the second calcined product in Comparative Example 8 shown in Table 2 is the same as the blending molar ratio of the first calcined product of Production Example 4.

Comparative Example 9

In Comparative Example 9, the second mixture was not prepared, and the second heat treatment was omitted. In this, the first calcined product 5 is an aluminate fluorescent material.

Example 13

In Example 13, the first calcined product 5 was used, and further $BaCO_3$, $Eu_2O_3$, MgO, $MnCO_3$, $Al_2O_3$ were used. The first calcined product 5 and the raw materials were mixed in a blending molar ratio to give a composition of $Ba_{0.9}Eu_{0.1}Mg_{0.5}Mn_{0.5}Al_{10}O_{17}$ shown in Table 2, thereby preparing a second mixture. The content of the first calcined product in this Example shown in Table 2 is in terms of mass % relative to 100% by mass of the second mixture. In the same manner as in Example 2 except that this second mixture was used, a second calcined product of an aluminate fluorescent material of Example 13 was produced.

Example 2A

In the same manner as in Example 2, a second calcined product of an aluminate fluorescent material of Example 2A was produced.

Example 14

In Example 14, the first calcined product 1 obtained in Production Example 1 was processed for dispersion treatment in such a manner that the first calcined product was dispersed in deionized water for 240 minutes in a polyethylene container using alumina balls as a solid dispersion medium, and then processed for wet-process screening, classification, dewatering, drying and dry-process screening in that order. Using the first calcined product 1 after the dispersion treatment, a calcined product was produced in the same manner as in Example 2, and then this was post-treated in the same manner as in Example 2 to give a second calcined product of an aluminate fluorescent material of Example 14. In Example 14, the blending molar ratio for the first calcined product 1, the flux molar ratio and the blending molar ratio for the second calcined product are the same as in Example 2.

Measurement of Particle Diameter and Dispersion Degree

In the same manner as that for the first calcined product of each Production Example, the average particle diameter D2 of the aluminate fluorescent material of Examples 1 to 13, 2A and 14 and Comparative Examples 1 to 9 was measured according to the FSSS method, and the volume-average particle diameter Dm2 (50% volume particle diameter) thereof was measured according to the laser diffraction scattering particle size distribution measuring method. From these values, the dispersion degree Dm2/D2 in Examples and Comparative Examples was calculated. The results are shown in Table 2 or Table 4. Regarding the aluminate fluorescent materials of Example 2A and Example 14, the 10% volume particle diameter D10 and the 90% volume particle diameter D90 thereof were measured, as cumulated from the small diameter side in the particle size distribution according to the laser diffraction scattering particle size distribution measuring method, and the particle diameter ratio D90/D10 was calculated. The results are shown in Table 4.

Measurement of Emission Spectrum

Figure 2:
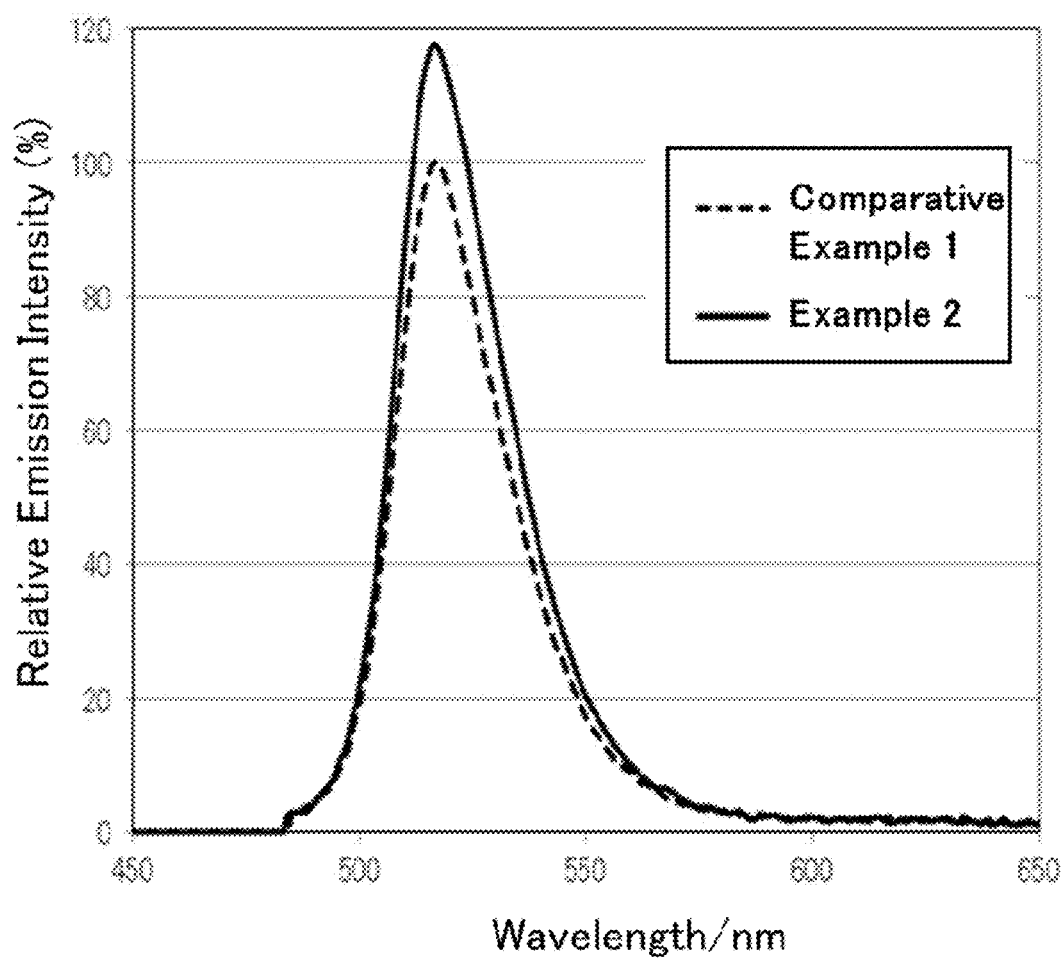
FIG. 2 shows the light emission spectra of the aluminate fluorescent materials according to example 2 and comparative example 1 of the present disclosure.

The aluminate fluorescent materials of Examples 1 to 13, 2A and 14 and Comparative Examples 1 to 9 were analyzed for the emission properties. Using a quantum efficiency measuring device (QE-2000, manufactured by Otsuka Electronics Co., Ltd.), each fluorescent material was irradiated with light having an excitation wavelength of 450 nm to measure the emission spectrum thereof at room temperature (25° C.±5° C.). Emission spectra of the relative emission intensity (%) to wavelength of the aluminate fluorescent materials of Example 2 and Comparative Example 1 are shown in FIG. 2.

Emission Peak Wavelength (nm)

The emission peak wavelength (nm), at which the emission spectrum is the highest, of the aluminate fluorescent material of Examples 1 to 13 and Comparative Examples 1 to 9 was read. The results are shown in Table 2.

Relative Emission Intensity (%)

From the measured emission spectrum of the aluminate fluorescent material of Examples 1 to 8, 2A and 14 and Comparative Examples 1 to 5, the relative emission intensity thereof was calculated taking the emission intensity at the emission peak wavelength of Comparative Example 1 as 100%. The results are shown in Table 2 or Table 4.

From the measured emission spectrum of the aluminate fluorescent material of Example 9 and Comparative Example 6, the relative emission intensity thereof was calculated taking the emission intensity at the emission peak wavelength of Comparative Example 6 as 100%. The results are shown in Table 2.

From the measured emission spectrum of the aluminate fluorescent material of Examples 10 to 12 and Comparative Examples 7 and 8, the relative emission intensity thereof was calculated taking the emission intensity at the emission peak wavelength of Comparative Example 7 as 100%. The results are shown in Table 2.

From the measured emission spectrum of the aluminate fluorescent material of Example 13 and Comparative Example 9, the relative emission intensity thereof was calculated with reference to the emission intensity at the emission peak wavelength of Comparative Example 9, 100%. The results are shown in Table 2.

SEM Micrograph

Figure 3:
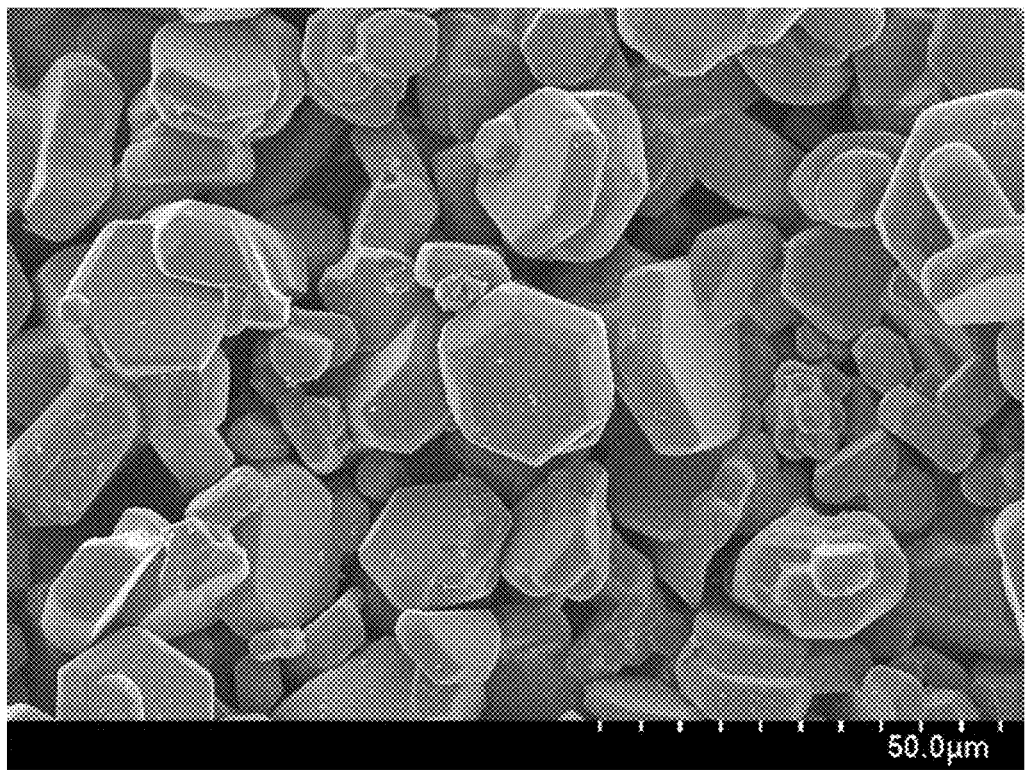
FIG. 3 is a SEM micrograph of the aluminate fluorescent material according to example 2 of the present disclosure.
Figure 4:
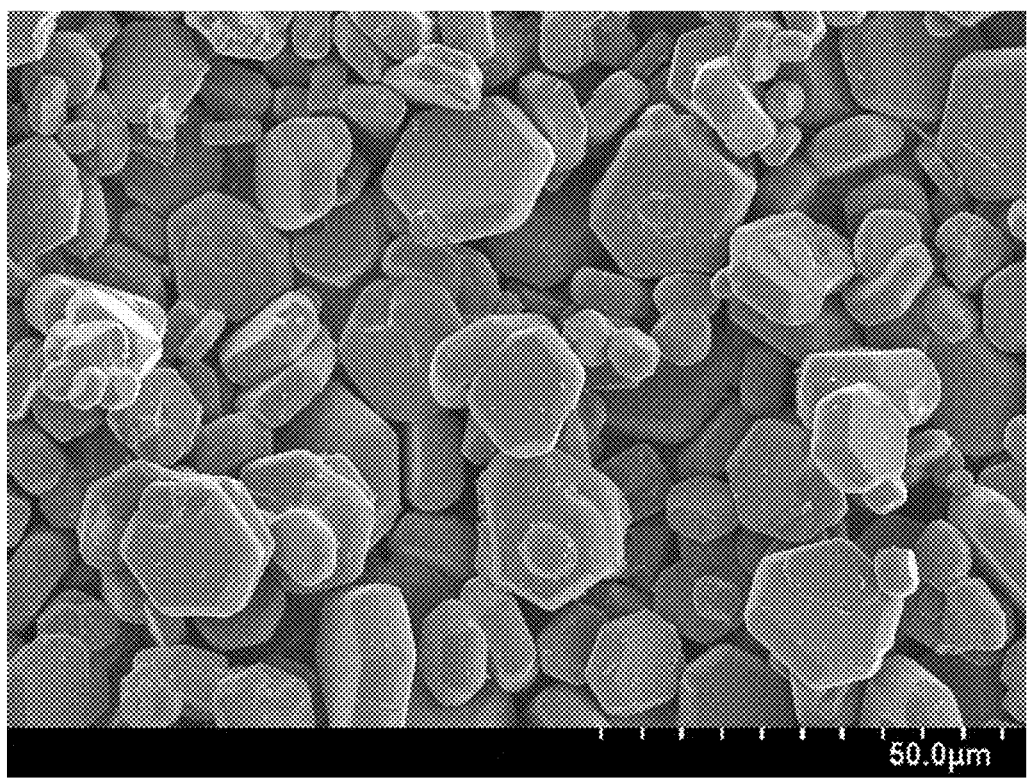
FIG. 4 is a SEM micrograph of the aluminate fluorescent material according to comparative example 1.

Using a scanning electron microscope (SEM), SEM micrograph of the aluminate fluorescent material of Example 2 and the aluminate fluorescent material of Comparative Example 1 were taken. FIG. 3 shows the SEM micrograph of the aluminate fluorescent material of Example 2, and FIG. 4 is the SEM micrograph of the aluminate fluorescent material of Comparative Example 1.

Average Circle-Equivalent Diameter Dc

Using a scanning electron microscope (SEM), SEM image of the aluminate fluorescent material of Example 2 and the aluminate fluorescent material of Comparative Example 1 were taken at 1,000-fold magnification, and the SEM images were analyzed using an image analyzing software (WinROOF2013, manufactured by Mitani Corporation), and on the SEM images on which fluorescent material particles having a particle diameter of 1 μm or less were excluded, 20 or more fluorescent particles that could be individually identified in point of the contour thereof were binarized. On the SEM images, the particle diameter of the fluorescent material particles is the longest diameter of each particle. Regarding the sample of the binarized 20 or more particles, the binarized particle shape was estimated as a circle, and the diameter of a precise circle having the same area as that of the estimated circle was referred to as a circle-equivalent diameter. An average value Av of the particle size distribution of the circle-equivalent diameter of the sample of the measured 20 or more particles and a standard deviation σ thereof were calculated, and the circle-equivalent diameter of a numerical value not satisfying a numerical value of (average value Av−standard deviation σ) or more and a numerical value of (average value Av+standard deviation σ) or less was excluded, and the mathematical average value of the circle-equivalent diameter of the remaining samples (15 samples in Example 2, 16 samples in Comparative Example 1) was referred to as an average circle-equivalent diameter Dc. The results are shown in Table 3. The average value Av of the circle-equivalent diameter of the aluminate fluorescent material of Example 2 was 13.8 μm, and the standard deviation σ thereof was 3.95. The average value Av of the circle-equivalent diameter of the aluminate fluorescent material of Comparative Example 1 was 12.2 μm, and the standard deviation σ thereof was 4.00.

Light Emitting Device

The aluminate fluorescent material of Examples 2A and 14 was used as a first fluorescent material, and this was mixed and dispersed with a second fluorescent material and a silicone resin, and defoamed to prepare a fluorescent member composition. The blending ratio in preparing the fluorescent member composition was so controlled that the mixed light that the light emitting device to be produced is to emit could have x at about 0.26 or so and y at about 0.22 or so (x=0.26, y=0.22) on the xy chromaticity coordinate system defined in CIE 1931. On a blue emitting LED (light emitting element) having an emission peak wavelength of 450 nm, the fluorescent member composition was deposited and cured to produce the light emitting device 100 shown in FIG. 1.

Relative Luminous Flux

Using a total luminous flux measuring device with an integrating sphere, the luminous flux of each light emitting device using the aluminate fluorescent material of Example 2A or Example 14 was measured. The luminous flux of the light emitting device using the aluminate fluorescent material of Example 2A was referred to as 100%, and the relative luminous flux of the light emitting device using the aluminate fluorescent material of Example 14 was calculated. The results are shown in Table 4.

TABLE 2

| | First Calcined Product | | Flux Contained in Second Mixture | | | | Second Calcined Product Blending Molar Ratio (mol) | | | | | Average Particle Diameter D2 (FSSS) (μm) | Volume-Average Particle Diameter Dm2 (laser diffraction) (μm) | Dispersion Degree Dm2/D2 | Emission Spectrum | |
|---|---|---|---|---|---|---|---|---|---|---|---|---|---|---|---|---|
| | | | Content | First Flux Molar Number (mol) | | Second Flux Molar Number (mol) | | | | | | | | | | Emission Peak Wavelength (nm) | Relative Emission Intensity (%) |
| Number | D1 (FSSS) (μm) | (% by mass) | Mg | Al | Na | K | Ba | Eu | Mg | Mn | Al | | | | | |
| Comparative Example 1 | 1 | 11.6 | 100 | — | — | — | — | — | — | — | — | — | 11.6 | 17.0 | 1.5 | 517 | 100.0 |
| Example 1 | | | 10 | 0.100 | — | 0.050 | — | 1.00 | — | 0.45 | 0.50 | 10.00 | 14.8 | 24.0 | 1.6 | 517 | 107.9 |
| Example 2 | | | 30 | 0.100 | — | 0.050 | — | 1.00 | — | 0.45 | 0.50 | 10.00 | 19.0 | 30.4 | 1.6 | 517 | 117.5 |
| Example 3 | | | 50 | 0.100 | — | 0.050 | — | 1.00 | — | 0.45 | 0.50 | 10.00 | 16.5 | 25.6 | 1.6 | 516 | 113.8 |
| Example 4 | | | 60 | 0.100 | — | 0.050 | — | 1.00 | — | 0.45 | 0.50 | 10.00 | 15.5 | 25.3 | 1.6 | 516 | 115.7 |
| Example 5 | | | 70 | 0.100 | — | 0.050 | — | 1.00 | — | 0.45 | 0.50 | 10.00 | 15.5 | 23.5 | 1.5 | 517 | 113.3 |
| Example 6 | | | 80 | 0.100 | — | 0.050 | — | 1.00 | — | 0.45 | 0.50 | 10.00 | 14.0 | 22.6 | 1.6 | 517 | 110.3 |
| Example 7 | | | 90 | 0.100 | — | 0.050 | — | 1.00 | — | 0.45 | 0.50 | 10.00 | 13.2 | 20.5 | 1.6 | 517 | 106.9 |
| Comparative Example 2 | | | 100 | — | — | — | — | 1.00 | — | 0.45 | 0.50 | 10.00 | 12.4 | 18.1 | 1.5 | 516 | 104.7 |
| Comparative Example 3 | 2 | 10.4 | 100 | — | — | — | — | — | — | — | — | — | 10.4 | 15.5 | 1.5 | 517 | 91.7 |
| Example 8 | | | 30 | 0.100 | — | 0.050 | — | 1.00 | — | 0.45 | 0.50 | 10.00 | 18.5 | 30.3 | 1.6 | 517 | 112.7 |
| Comparative Example 4 | 20 | 3.6 | 30 | 0.100 | — | 0.050 | — | 1.00 | — | 0.45 | 0.50 | 10.00 | 7.6 | 13.9 | 1.8 | 516 | 78.7 |
| Comparative Example 5 | 21 | 5.4 | 30 | 0.100 | — | 0.050 | — | 1.00 | — | 0.45 | 0.50 | 10.00 | 10.6 | 18.3 | 1.7 | 516 | 87.6 |
| Comparative Example 6 | 3 | 11.4 | 100 | — | — | — | — | — | — | — | — | — | 11.4 | 19.8 | 1.7 | 517 | 100.0 |
| Example 9 | | | 30 | 0.100 | — | 0.050 | | 1.00 | | 0.45 | 0.50 | 10.00 | 19.5 | 33.1 | 1.7 | 517 | 116.5 |
| Comparative Example 7 | 4 | 9.8 | 100 | — | — | — | — | — | — | — | — | — | 9.8 | 15.4 | 1.6 | 519 | 100.0 |
| Example 10 | | | 10 | — | 0.067 | 0.050 | — | 1.00 | — | — | 0.50 | 10.00 | 13.4 | 25.5 | 1.9 | 519 | 112.4 |
| Example 11 | | | 30 | — | 0.067 | 0.050 | — | 1.00 | — | — | 0.50 | 10.00 | 17.0 | 33.0 | 1.9 | 519 | 123.0 |
| Example 12 | | | 50 | — | 0.067 | 0.050 | — | 1.00 | — | — | 0.50 | 10.00 | 15.0 | 28.6 | 1.9 | 519 | 119.2 |
| Comparative Example 8 | | | 100 | — | — | — | — | 1.00 | — | — | 0.50 | 10.00 | 10.4 | 17.1 | 1.6 | 520 | 106.6 |
| Comparative Example 9 | 5 | 11.2 | 100 | — | — | — | — | — | — | — | — | — | 11.2 | 17.3 | 1.5 | 517 | 100.0 |
| Example 13 | | | 30 | 0.100 | — | 0.050 | — | 0.90 | 0.10 | 0.50 | 0.50 | 10.00 | 18.0 | 32.8 | 1.8 | 516 | 120.6 |

As shown in Table 2, in the aluminate fluorescent materials according to Examples 1 to 13, the second mixture using the first calcined product having an average particle diameter D1 of 6 μm or more was subjected to second heat treatment, and the first calcined product acted as a seed crystal to promote crystal growth. Consequently, aluminate fluorescent materials having a large average particle size, precisely, having an average particle size D2, as measured according to the FSSS method, of 13 μm or more and having a volume-average particle size Dm2, as measured according to a laser diffraction scattering particle size distribution measuring method, of 20 μm or more could be obtained. The aluminate fluorescent materials according to Examples 1 to 13 had a higher relative emission intensity than those of Comparative Examples 1, 6, 7 and 9.

As shown in Examples 2 to 6, the aluminate fluorescent materials using the second mixture containing the first calcined product having an average particle diameter D1 of 6 μm or more, in an amount of 30% by mass or more and 80% by mass or less had a high relative emission intensity of more than 110%.

On the other hand, in the aluminate fluorescent materials according to Comparative Examples 2 and 8, the second mixture was not prepared and for these, the second heat treatment was carried out not using a flux. In these, therefore, the crystal growth was not sufficient, that is, the average particle diameter D2 measured according to the FSSS method was less than 13 μm, and the volume-average particle diameter Dm2 measured according to a laser diffraction scattering particle size distribution measuring method was less than 20 μm. The relative emission intensity of the aluminate fluorescent material according to Comparative Example 2 was lower than that of the aluminate fluorescent materials of Examples 1 to 7. The relative emission intensity of the aluminate fluorescent material according to Comparative Example 8 was also lower than that of the aluminate fluorescent materials according to Examples 10, 11 and 12.

In the aluminate fluorescent material according to Example 8, the first calcined product 2 having a smaller particle diameter than that of the first calcined product 1 used in Comparative Example 1 was used, but through the heat treatment of the second mixture containing the first flux and the second flux, the crystals well grew well so that both the average particle diameter D2 and the volume-average particle diameter Dm2 of the second calcined product were larger than those in Comparative Example 1, and the relative emission intensity also increased. On the other hand, the relative emission intensity of the aluminate fluorescent material according to Comparative Example 3 was lower than that of Example 8 or Comparative Example 1. This is considered to be because the average particle diameter D1 of the first calcined product used as the aluminate fluorescent material in Comparative Example 3 was smaller than the average particle diameter D1 of the first calcined product used as the aluminate fluorescent material in Comparative Example 1.

The aluminate fluorescent materials according to Comparative Examples 4 and 5 had a lower relative emission intensity than the aluminate fluorescent material according to Example 8, and had a lower relative emission intensity than the aluminate fluorescent material according to Comparative Example 1. This is considered to be because the crystal growth would not be still sufficient even though the second heat treatment was carried out using the second mixture containing the first calcined product having an average particle diameter D1, according to the FSSS method, of less than 6 μm.

TABLE 3

| | Average Circle-Equivalent Diameter Dc (μm) | Number of Samples for Average Circle-Equivalent Diameter | Average Value of Circle-Equivalent Av (μm) | Standard σ | Number of Samples for Circle-Equivalent Diameter |
|---|---|---|---|---|---|
| Example 2 | 14.3 | 15 | 13.8 | 3.95 | 23 |
| Comparative Example 1 | 12.4 | 16 | 12.2 | 4.00 | 23 |

As shown in Table 3, the aluminate fluorescent material according to Example 2 had a large average circle-equivalent diameter Dc of 14.3 μm. On the other hand, the aluminate fluorescent material according to Comparative Example 1 had an average circle-equivalent diameter Dc of less than 13 μm. The aluminate fluorescent material according to Example 2 had a higher relative emission intensity than the aluminate fluorescent material according to Comparative Example 1.

fore the luminous flux achievable by the light emitting device would have increased.

In addition, as shown in Table 4, the aluminate fluorescent material according to Example 14 had a particle diameter ratio D90/D10 of 2.5 and the dispersion degree in the volume-based particle size distribution was good, that is, the fluctuation in the individual fluorescent material particles was small and the material had a relatively uniform particle size. Consequently, the dispersibility of the fluorescent material in the fluorescent member in the light emitting device 100 improved more, and the luminous flux achievable by the light emitting device would have greatly increased.

As shown in FIG. 2, it is confirmed that the emission peak wavelength in the emission spectrum of the aluminate fluorescent material according to Example 2 shows no change from that in the emission spectrum of the aluminate fluorescent material according to Comparative Example 1, and the relative emission intensity of the former is higher.

As shown in the SEM micrograph of FIG. 3, the aluminate fluorescent material according to Example 2 includes a tabular crystal having at least one hexagonal face and showing a hexagonal crystal structure. As shown in the SEM micrograph of FIG. 4, the aluminate fluorescent material according to Comparative Example 1 also includes a tabular crystal having at least one hexagonal face and showing a hexagonal crystal structure. It is confirmed that the average particle diameter of the aluminate fluorescent material according to Example 2 shown in FIG. 3 is larger than the average particle diameter of the aluminate fluorescent material according to Comparative Example 1 shown in FIG. 4, but there is no significant difference between the two in the particle shape.

Figure 5:
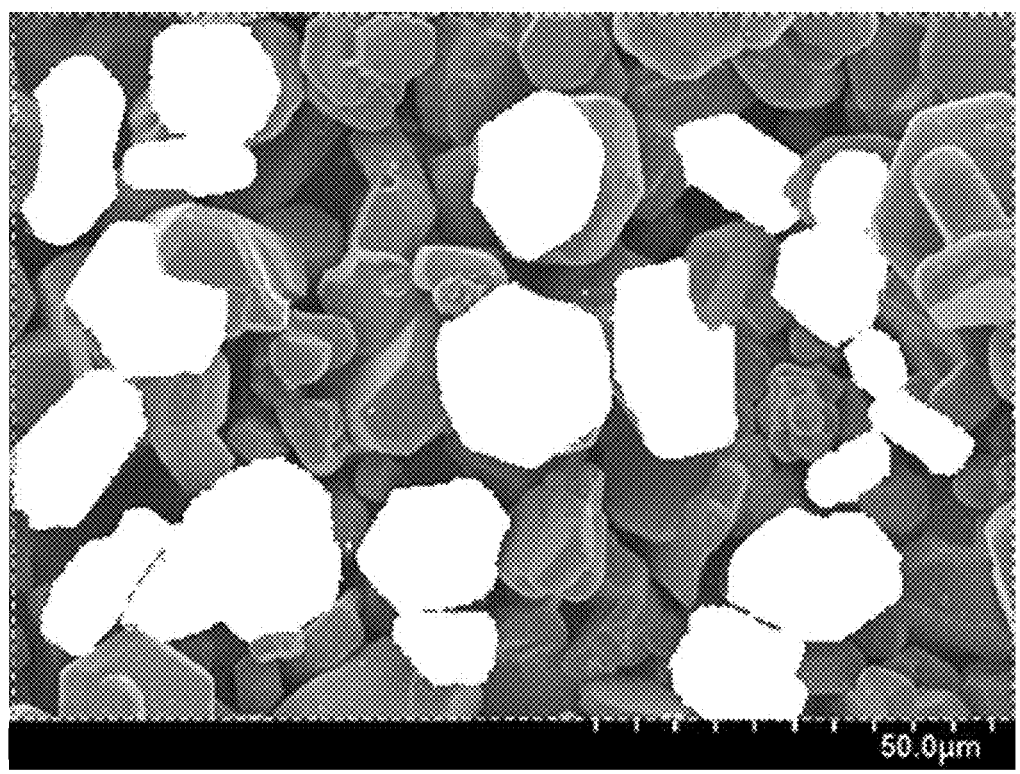
FIG. 5 is an image view showing a binarized state of 20 or more aluminate fluorescent material particles in the SEM micrograph of the aluminate fluorescent material according to example 2 of the present disclosure.
Figure 6:
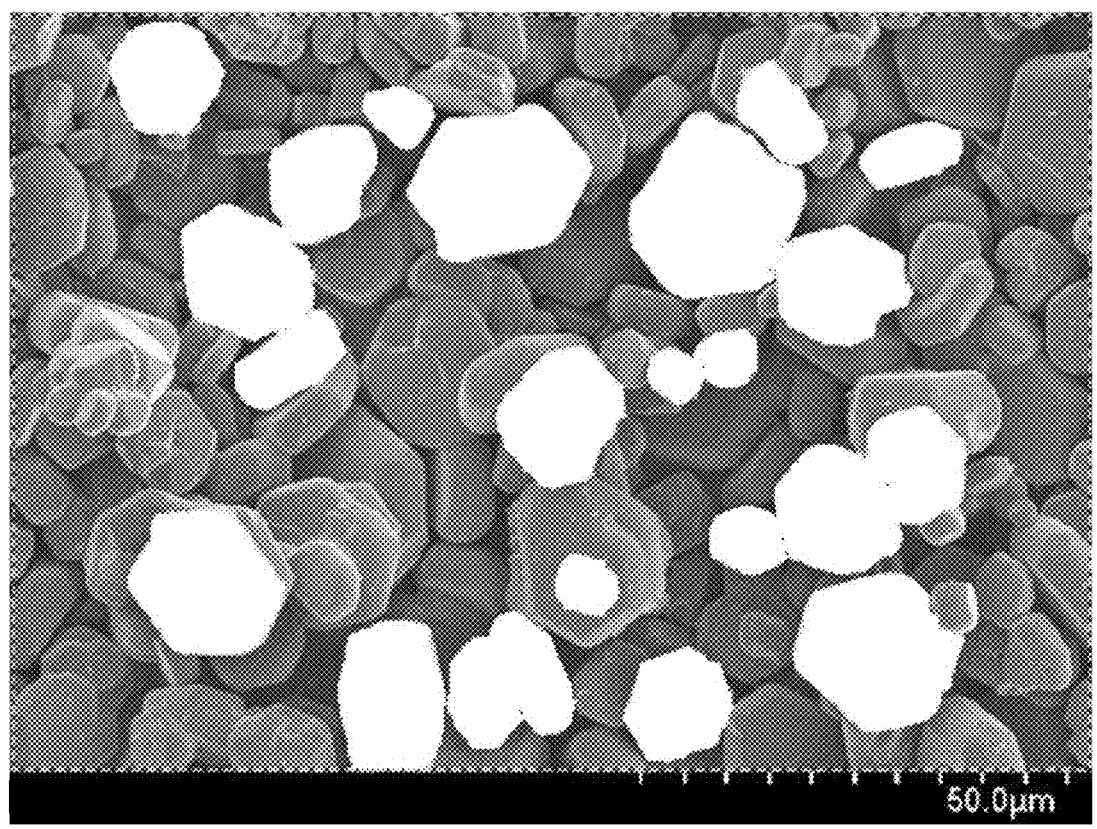
FIG. 6 is an image view showing a binarized state of 20 or more aluminate fluorescent material particles in the SEM micrograph of the aluminate fluorescent material according to comparative example 1.

FIG. 5 is an image view in which 20 or more arbitrarily selected fluorescent material particles have been binarized in the SEM micrograph of the aluminate fluorescent material according to Example 2, and FIG. 6 is an image view in

TABLE 4

| | FSSS Method | Laser Diffraction Scattering Particle Size Distribution Measuring Method | | | Dispersion Degree Dm2/D2 | Particle Diameter Ratio D90/D10 | Relative Emission Intensity (%) | Relative Luminous Flux (%) |
|---|---|---|---|---|---|---|---|---|
| | D2 (μm) | Dm2 | D10 (μm) | D90 | | | | |
| Example 2A | 18.5 | 31.6 | 19.0 | 51.2 | 1.7 | 2.7 | 118.6 | 100.0 |
| Example 14 | 18.5 | 24.1 | 15.3 | 37.8 | 1.3 | 2.5 | 116.5 | 103.8 |

As shown in Table 4, the aluminate fluorescent material according to Example 14 had a dispersion degree Dm2/D2 of 1.3. On the other hand, the aluminate fluorescent material according to Example 2A had a dispersion degree Dm2/D2 of more than 1.6. The aluminate fluorescent material according to Example 14 had a lower relative emission intensity and a higher relative luminous flux than the aluminate fluorescent material according to Example 2A. From the result, the aluminate fluorescent material according to Example 14 had a dispersion degree Dm2/D2 of 1.3 and could well disperse in the fluorescent member in the light emitting device 100, that is, the filling rate thereof in the fluorescent member was high and the thickness of the fluorescent material deposit layer could be small, and therefore which 20 or more arbitrarily selected fluorescent material particles have been binarized in the SEM micrograph of the aluminate fluorescent material according to Comparative Example 1. In the SEM micrograph of the aluminate fluorescent material of Example 2 in FIG. 5, the binarized image view of 20 or more fluorescent material particles is compared with the binarized image view of 20 or more fluorescent material particles in the SEM micrograph of the aluminate fluorescent material of Comparative Example 1 in FIG. 6, and it is known that the number of the aluminate fluorescent particles having a large particle diameter in FIG. 5 according to Example 2 would be large. The aluminate fluorescent material of Example 2 had a large average circle-equivalent diameter Dc of 14.3 μm, while the aluminate fluorescent material of Comparative Example 1 had an average circle-equivalent diameter Dc of less than 13 μm.

The aluminate fluorescent material obtained according to the production method of one embodiment of the present invention had a high emission intensity, and the light emitting device using the aluminate fluorescent material can be used in a broad field of ordinary lightings, in-car lightings, displays, backlights for liquid-crystal devices, traffic lights, and illumination-type switches, etc.

The invention claimed is:

1. A method of producing an aluminate fluorescent material, comprising:
    subjecting a first mixture prepared by mixing a compound containing at least one metal element selected from the group consisting of Ba, Sr and Ca, at least one compound selected from the group consisting of a compound containing Mn and a compound containing Eu, and a compound containing Al, in which a compound containing Mg is optionally mixed, to first heat treatment to give a first calcined product having an average particle diameter D1, as measured according to a Fisher Sub-Sieve Sizer method, of 6 μm or more; and
    subjecting a second mixture prepared by mixing a compound containing at least one metal element selected from the group consisting of Ba, Sr and Ca, at least one compound selected from the group consisting of a compound containing Mn and a compound containing Eu, a compound containing Al, and the first calcined product in an amount of 10% by mass or more and 90% by mass or less relative to the total amount of the second mixture, in which a compound containing Mg is optionally mixed, to second heat treatment to give a second calcined product.

2. The method of producing an aluminate fluorescent material according to claim 1, wherein at least one of the first mixture and the second mixture further contains a flux, and the flux is a compound containing at least one metal element selected from the group consisting of K, Na, Ba, Sr, Ca, Mg, Al and Mn.

3. The method of producing an aluminate fluorescent material according to claim 2, wherein the flux is a fluoride.

4. The method of producing an aluminate fluorescent material according to claim 2, wherein the molar number of the metal element contained in the flux is 0.03 or more and 0.6 or less, when the molar number of Al contained in the flux-free first mixture and/or the flux-free second mixture is taken as 10.

5. The method of producing an aluminate fluorescent material according to claim 2, wherein the flux contains two kinds of fluxes, a first flux and a second flux, the first flux is a compound containing at least one metal element selected from the group consisting of Ba, Sr, Ca, Mg, Al and Mn, and the second flux is a compound containing at least one metal element selected from K and Na.

6. The method of producing an aluminate fluorescent material according to claim 5, wherein the molar number of the metal element contained in the first flux is 0.006 or more and 0.55 or less, when the molar number of Al contained in the flux-free first mixture and/or the flux-free second mixture is taken as 10.

7. The method of producing an aluminate fluorescent material according to claim 5, wherein, when the metal element contained in the first flux is Mg or Al and the metal element contained in the second flux is K or Na, a molar ratio of the metal element contained in the first flux to the metal element contained in the second flux is within a range of 20:1 to 1:5.

8. The method of producing an aluminate fluorescent material according to claim 1, wherein at least one of the first calcined product and the second calcined product has a composition represented by the following formula (I):

$$X^1_p Eu_t Mg_q Mn_r Al_s O_{p+t+q+r+1.5s} \quad (I)$$

wherein $X^1$ represents at least one element selected from the group consisting of Ba, Sr and Ca, and p, q, r, s, and t each satisfy $0.5 \leq p \leq 1.0$, $0 \leq q \leq 1.0$, $0 \leq r \leq 0.7$, $8.5 \leq s \leq 13.0$, $0 \leq t \leq 0.5$, $0.5 \leq p+t \leq 1.2$, $0.1 \leq r+t \leq 0.7$, and $0.2 \leq q+r \leq 1.0$.

9. The method of producing an aluminate fluorescent material according to claim 1, wherein in the step of preparing the second calcined product, the content of the first calcined product in the second mixture is 25% by mass or more and 80% by mass or less.

10. An aluminate fluorescent material, which has an average particle diameter D2, as measured according to a Fisher Sub-Sieve Sizer method, of 13 μm or more and/or a volume-average particle diameter Dm2, as measured according to a laser diffraction scattering particle size distribution measuring method, of 20 μm or more, and has a composition represented by the following formula (I):

$$X^1_p Eu_t Mg_q Mn_r Al_s O_{p+t+q+r+1.5s} \quad (I)$$

wherein $X^1$ represents at least one element selected from the group consisting of Ba, Sr and Ca, and p, q, r, s, and t each satisfies $0.5 \leq p \leq 1.0$, $0 \leq q \leq 1.0$, $0 \leq r \leq 0.7$, $8.5 \leq s \leq 13.0$, $0 \leq t \leq 0.5$, $0.5 \leq p+t \leq 1.2$, $0.1 \leq r+t \leq 0.7$, and $0.2 \leq q+r \leq 1.0$.

11. The aluminate fluorescent material according to claim 10, which has a dispersion degree Dm2/D2, as defined as a ratio of the volume-average particle diameter Dm2 to the average particle diameter D2, in a range of 1.0 or more and less than 1.6.

12. The aluminate fluorescent material according to claim 11, which has the dispersion degree Dm2/D2 in a range of 1.0 or more and 1.5 or less.

13. The aluminate fluorescent material according to claim 10, which has a ratio D90/D10 of the 90% volume particle diameter D90 to the 10% volume particle diameter D10, as cumulated from the small diameter side in a particle size distribution according to a laser diffraction scattering particle size distribution measuring method, of 3.0 or less.

14. The aluminate fluorescent material according to claim 10, wherein $X^1$ in the formula (I) contains Ba.

15. The aluminate fluorescent material according to claim 10, wherein in the formula (I), q, r and s each satisfy $0 < q \leq 0.7$, $0.2 \leq r \leq 0.7$, and $9.0 \leq s \leq 13.0$.

16. An aluminate fluorescent material, which has an average circle-equivalent diameter Dc of 13 μm or more, and has a composition represented by the following formula (I):

$$X^1_p Eu_t Mg_q Mn_r Al_s O_{p+t+q+r+1.5s} \quad (I)$$

wherein $X^1$ represents at least one element selected from the group consisting of Ba, Sr and Ca, and p, q, r, s, and t each satisfies $0.5 \leq p \leq 1.0$, $0 \leq q \leq 1.0$, $0 \leq r \leq 0.7$, $8.5 \leq s \leq 13.0$, $0 \leq t \leq 0.5$, $0.5 \leq p+t \leq 1.2$, $0.1 \leq r+t \leq 0.7$, and $0.2 \leq q+r \leq 1.0$.

17. The aluminate fluorescent material according to claim 16, wherein $X^1$ in the formula (I) contains Ba.

18. The aluminate fluorescent material according to claim 16, wherein in the formula (I), q, r and s each satisfies $0 < q \leq 0.7$, $0.2 \leq r \leq 0.7$, and $9.0 \leq s \leq 13.0$.

19. A light emitting device comprising the aluminate fluorescent material of claim 10, and an excitation light source having an emission peak wavelength in a range of 380 nm or more and 485 nm or less.

20. A light emitting device comprising the aluminate fluorescent material of claim 16, and an excitation light source having an emission peak wavelength in a range of 380 nm or more and 485 nm or less.

* * * * *